(12) United States Patent
Cinar et al.

(10) Patent No.: US 11,979,996 B2
(45) Date of Patent: May 7, 2024

(54) MEMORY DEVICE AND ELECTRONIC DEVICE INCLUDING THE SAME

(71) Applicant: SAMSUNG ELECTRONICS CO., LTD., Suwon-si (KR)

(72) Inventors: Yusuf Cinar, Yongin-si (KR); Jae Hong Park, Suwon-si (KR); Han Hong Lee, Seoul (KR); Seon Gyun Baek, Suwon-si (KR); Won-Gi Hong, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 17/217,759

(22) Filed: Mar. 30, 2021

(65) Prior Publication Data
US 2021/0385956 A1 Dec. 9, 2021

(30) Foreign Application Priority Data

Jun. 9, 2020 (KR) .................. 10-2020-0069865
Sep. 10, 2020 (KR) .................. 10-2020-0115976

(51) Int. Cl.
*H05K 5/02* (2006.01)
*H01L 25/18* (2023.01)
*H05K 1/18* (2006.01)

(52) U.S. Cl.
CPC .......... *H05K 5/0217* (2013.01); *H05K 5/026* (2013.01); *H01L 25/18* (2013.01); *H05K 1/181* (2013.01); *H05K 2201/10159* (2013.01)

(58) Field of Classification Search
CPC .... H05K 5/0217; H05K 5/0008; H05K 5/026; H05K 7/20409; H05K 1/117;
(Continued)

(56) References Cited

U.S. PATENT DOCUMENTS

D327,071 S 6/1992 Derbyshire
D345,959 S 4/1994 Cooper
(Continued)

FOREIGN PATENT DOCUMENTS

CN 1510796 A * 7/2004
CN 111988944 A 11/2020
(Continued)

OTHER PUBLICATIONS

Translation of Foreign Patent DE-202018107272-U1 (Year: 2020).*
(Continued)

*Primary Examiner* — Abhishek M Rathod
(74) *Attorney, Agent, or Firm* — Myers Bigel, P.A.

(57) ABSTRACT

A memory device and an electronic device is provided. The memory device may include a memory module including a module board and a memory connector located on one side of the module board, a first enclosure placed above the memory module and a second enclosure placed below the memory module, wherein the first enclosure includes a first main cover which covers upper faces of the module board and the memory connector, at least one clamping hole which penetrates the main cover at a position overlapping the memory connector, an inter-device fastening pillar protruding downward from a lower face of the first main cover, and a coupling hole which is located inside the inter-device fastening pillar on a plane and penetrates the inter-device fastening pillar and the main cover.

20 Claims, 28 Drawing Sheets

(58) Field of Classification Search
CPC .............. H05K 1/181; H05K 7/20445; H05K 2201/10159; H01R 12/7023; H01R 12/721; H01R 12/73; H01R 13/621; H01L 25/18
See application file for complete search history.

(56) References Cited

U.S. PATENT DOCUMENTS

| | | | |
|---|---|---|---|
| D348,247 S | 6/1994 | Cooper | |
| 5,377,080 A | 12/1994 | Lin | |
| 5,673,181 A | 9/1997 | Hsu | |
| D384,648 S | 10/1997 | Seirio | |
| D400,512 S | 11/1998 | Korhonen | |
| 6,287,143 B1 | 9/2001 | Lwee | |
| 6,317,317 B1 | 11/2001 | Lu et al. | |
| 6,811,413 B2* | 11/2004 | Keeble | G02B 6/4277 439/83 |
| 7,352,601 B1 | 4/2008 | Minneman et al. | |
| D570,795 S | 6/2008 | Horng | |
| D660,787 S | 5/2012 | Lambert et al. | |
| D669,427 S | 10/2012 | Ignor et al. | |
| 8,894,427 B2* | 11/2014 | Agreda de Ro | H01R 13/44 439/142 |
| 9,135,957 B2 | 9/2015 | Grobe et al. | |
| D743,399 S | 11/2015 | Frank | |
| D768,134 S | 10/2016 | Andre et al. | |
| 9,501,110 B2 | 11/2016 | Heyd et al. | |
| 9,583,153 B1 | 2/2017 | Sarraf et al. | |
| 9,607,914 B2 | 3/2017 | Gwin | |
| 9,927,851 B2* | 3/2018 | Potter | G06F 1/183 |
| 9,955,596 B2* | 4/2018 | Voss | H05K 3/361 |
| D826,944 S | 8/2018 | Lim et al. | |
| D826,945 S | 8/2018 | Lim et al. | |
| D828,358 S | 9/2018 | Lim et al. | |
| 10,140,063 B2 | 11/2018 | Worley et al. | |
| 10,186,471 B2* | 1/2019 | Chen | G06F 1/20 |
| 10,255,215 B2* | 4/2019 | Breakstone | G06F 13/16 |
| 10,261,554 B1 | 4/2019 | Lin | |
| 10,346,735 B1 | 7/2019 | Lee | |
| 10,349,542 B2 | 7/2019 | Chen et al. | |
| 10,356,927 B2* | 7/2019 | Ehlen | H05K 5/0282 |
| 10,365,697 B2* | 7/2019 | Mundt | G06F 1/187 |
| 10,416,731 B2 | 9/2019 | Heyd et al. | |
| 10,477,706 B1* | 11/2019 | Wang | H05K 5/0008 |
| 10,520,994 B2* | 12/2019 | Murillo | G06F 13/4081 |
| 10,582,644 B1* | 3/2020 | Hur | H05K 7/20454 |
| 10,622,026 B1* | 4/2020 | Tsorng | H05K 5/0282 |
| D888,000 S | 6/2020 | Lim | |
| D896,229 S | 9/2020 | Jun | |
| D907,031 S | 1/2021 | Fitzgerald et al. | |
| 10,929,327 B1* | 2/2021 | Schrempp | G06F 13/4068 |
| D921,627 S | 6/2021 | Jun | |
| 11,023,020 B2* | 6/2021 | Wong | H05K 7/1427 |
| 11,092,996 B2* | 8/2021 | Lee | H05K 5/023 |
| D943,586 S | 2/2022 | Jun | |
| 11,272,640 B2* | 3/2022 | Hur | H05K 7/20472 |
| 11,275,415 B2* | 3/2022 | Dallaserra | G06F 1/20 |
| 11,385,689 B2* | 7/2022 | Khan | H05K 7/2039 |
| D967,823 S | 10/2022 | Crisp et al. | |
| 11,585,359 B2 | 2/2023 | Lu | |
| 11,632,878 B2 | 4/2023 | Li | |
| 2003/0171013 A1* | 9/2003 | Keeble | G02B 6/4261 439/79 |
| 2008/0144270 A1 | 6/2008 | Dal Porto et al. | |
| 2011/0261524 A1 | 10/2011 | Wieder et al. | |
| 2012/0145796 A1 | 6/2012 | Hsieh | |
| 2013/0102166 A1 | 4/2013 | Wang et al. | |
| 2013/0171846 A1* | 7/2013 | Agreda de Ro | H01R 13/447 439/136 |
| 2014/0160661 A1* | 6/2014 | Mangay-Ayam, Jr. | H05K 1/0203 312/223.1 |
| 2015/0049438 A1* | 2/2015 | Derovanessian | H05K 7/20463 361/714 |
| 2015/0138735 A1* | 5/2015 | Oh | H05K 1/181 361/736 |
| 2015/0355686 A1* | 12/2015 | Heyd | G11B 33/128 361/679.31 |
| 2016/0118753 A1 | 4/2016 | Ikuta et al. | |
| 2016/0306398 A1 | 10/2016 | Lin | |
| 2017/0220505 A1* | 8/2017 | Breakstone | G06F 13/4282 |
| 2017/0257960 A1 | 9/2017 | Dohi | |
| 2017/0322605 A1* | 11/2017 | Potter | G06F 1/187 |
| 2017/0351304 A1 | 12/2017 | Mundt et al. | |
| 2018/0210519 A1* | 7/2018 | Heyd | G06F 1/187 |
| 2018/0321715 A1 | 11/2018 | Gopalakrishna et al. | |
| 2019/0045651 A1* | 2/2019 | Ehlen | E05B 65/006 |
| 2019/0235589 A1* | 8/2019 | Murillo | G06F 1/266 |
| 2019/0286197 A1* | 9/2019 | Khan | G06F 1/20 |
| 2019/0354145 A1* | 11/2019 | Kim | G06F 3/0679 |
| 2020/0137896 A1* | 4/2020 | Elenitoba-Johnson | H05K 7/20154 |
| 2020/0154606 A1* | 5/2020 | Hur | H05K 7/20472 |
| 2020/0174533 A1* | 6/2020 | Long | H05K 7/20145 |
| 2020/0235025 A1* | 7/2020 | Shimizu | H01L 23/367 |
| 2020/0301488 A1* | 9/2020 | Dallaserra | G06F 1/206 |
| 2020/0302259 A1 | 9/2020 | Kanaoka et al. | |
| 2020/0375064 A1 | 11/2020 | Chen et al. | |
| 2021/0015006 A1* | 1/2021 | Muto | H05K 5/0213 |
| 2021/0034124 A1 | 2/2021 | Adrian | |
| 2021/0055768 A1* | 2/2021 | Lee | H05K 7/02 |
| 2021/0133139 A1* | 5/2021 | Hipes | G06F 3/0626 |
| 2021/0294386 A1* | 9/2021 | Eliyahu | G06F 1/181 |
| 2022/0015267 A1 | 1/2022 | Bucher et al. | |
| 2022/0256731 A1* | 8/2022 | Gurlt | H05K 7/1462 |
| 2022/0394862 A1 | 12/2022 | Okubo | |

FOREIGN PATENT DOCUMENTS

| | | | |
|---|---|---|---|
| CN | 113939144 A | 1/2022 | |
| CN | 115440673 A | 12/2022 | |
| DE | 202018107272 U1 * | 4/2019 | G06F 1/20 |
| DE | 202020003265 U1 | 12/2020 | |
| EP | 0710955 A2 | 5/1996 | |
| EP | 1494518 A1 | 1/2005 | |
| FR | 3063863 A1 | 9/2018 | |
| JP | 2018195436 A | 12/2018 | |
| KR | 20170000709 A | 1/2017 | |
| WO | 2014123774 A1 | 8/2014 | |
| WO | 2015023628 A1 | 2/2015 | |

OTHER PUBLICATIONS

Translation of DE-202018107272-U1 (Year: 2019).*
Translation of CN-1510796-A (Year: 2004).*
"Communication with Partial European Search Report", EP Application No. 21163979.4, dated Sep. 21, 2021, 19 pp.
"Bykski B-NVME-CT M.2 SSD Aluminum Hard Disk Armor (Black) [online]", Retrieved Jan. 12, 2024 from internet: https://www.amazon.com/Bykski-B-NVME-CT-Aluminum-Armor-Black/dp/B08B2G83LV, 4 pp.

* cited by examiner

MEMORY DEVICE AND ELECTRONIC DEVICE INCLUDING THE SAME

This application claims priority from Korean Patent Application Nos. 10-2020-0069865 filed on Jun. 9, 2020 and 10-2020-0115976 filed on Sep. 10, 2020 in the Korean Intellectual Property Office, the disclosures of which are incorporated herein by reference in their entireties.

BACKGROUND

1. Field of the Invention

The present disclosure relates to a memory device and an electronic device including the same.

2. Description of the Related Art

A memory device represented by a SSD (Solid State Drive) is widely used not only for traditional electronic devices such as a desktop PC, a tablet PC, and a laptop PC, but also for mobility-related electronic devices such as an automobile, a drone, and an aircraft. The electronic device may be exposed to a variety of environments. For example, when the memory device is utilized in an automobile, it may be impacted by vibration, a vehicle accident, or the like, and in some cases, it may be exposed to a high temperature. In addition, external shocks may threaten the mechanical reliability of the memory device. Furthermore, a high temperature environment may cause malfunction of the memory device.

SUMMARY

Aspects of the present disclosure provide memory devices having excellent mechanical strength and increased heat capacity.

Aspects of the present disclosure also provide electronic devices having excellent mechanical strength and increased heat capacity.

However, aspects of the present disclosure are not restricted to the one set forth herein. The and other aspects of the present disclosure will become more apparent to one of ordinary skill in the art to which the present disclosure pertains by referencing the detailed description of the present disclosure given below.

According to an aspect of the present disclosure, a memory device includes an enclosure assembly and a memory module disposed within the enclosure assembly. The memory module includes a module board and a memory connector located on one side of the module board. The enclosure assembly includes a first enclosure above the memory module and a second enclosure below the memory module. The first enclosure includes a first main cover which covers upper faces of the module board and the memory connector. At least one clamping hole penetrates the main cover at a location that overlaps the memory connector. An inter-device fastening pillar protrudes downward from a lower face of the first main cover. A coupling hole extends through the inter-device fastening pillar and the main cover.

According to an aspect of the present disclosure, a memory device includes an enclosure assembly and a memory module disposed within the enclosure assembly. The memory module includes a module board, and a memory connector located on one side of the module board. The enclosure assembly includes a first enclosure above the memory module and a second enclosure below the memory module. The first enclosure includes a first main cover that covers upper faces of the module board and the memory connector. The second enclosure includes a second main cover. At least one of the first main cover and the second main cover includes a base part and a fin protruding outward from the base part.

According to an aspect of the present disclosure, an electronic includes a memory module having a memory connector located on one side face, and an enclosure assembly which accommodates the memory module. The enclosure assembly includes one or more clamping holes on an upper face thereof. A connector body includes a connector hole and a slot. A host connector is configured to be installed on an upper face of the connector body and includes a latch having a hook.

BRIEF DESCRIPTION OF THE DRAWINGS

The above and other aspects and features of the present disclosure will become more apparent by describing in detail exemplary embodiments thereof referring to the attached drawings, in which.

DETAILED DESCRIPTION OF THE EMBODIMENTS

Hereinafter, various embodiments of the present disclosure will be explained referring to the accompanying drawings.

Figure 1:
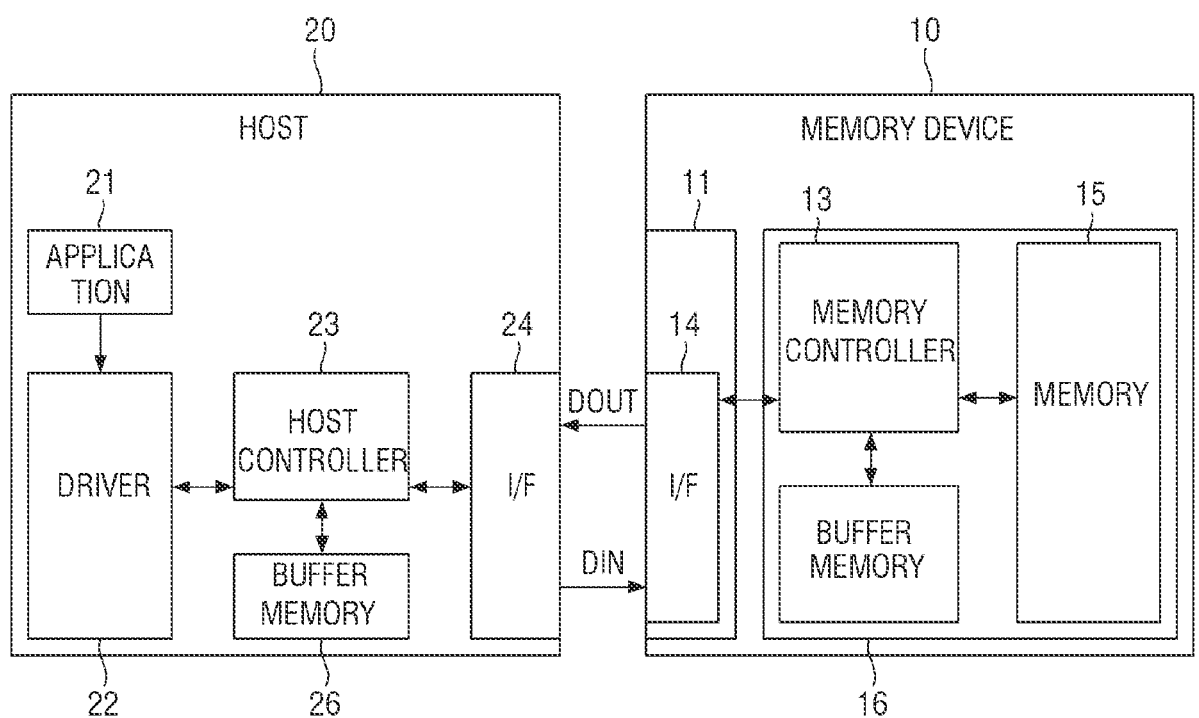
FIG. 1 is a block diagram of a memory system according to an embodiment.

FIG. 1 is a block diagram of a memory system according to an embodiment.

Referring to FIG. 1, the memory system includes a host 20 and a memory device 10. The host 20 and the memory device 10 may communicate with each other through a predetermined interface. The interface may be, for example, but is not limited to, a UFS (Universal Flash Storage), a SAS (Serial Attached SCSI), a SATA (Serial Advanced Technology Attachment), a PCIe (Peripheral Component Interconnect Express), an eMMC (embedded MultiMediaCard), a FC (Fibre Channel), an ATA (Advanced Technology Attachment), an IDE (Intergrated Drive Electronics), a USB (Universal Serial Bus), an IEEE 1394 (Firewire) and the like.

The host 20 controls the overall operation of the memory device 10. The host 20 may include, an application 21, a driver 22, a host controller 23, a buffer memory 26 and a host interface 24.

The application 21 may control an electronic device on the basis of command sets that may be used in the electronic device. The application 21 may support, for example, but is not limited to, SCSI (Small Computer System Interface) command sets.

The driver 22 may drive the memory device 10 connected to the host 20. Specifically, the driver 22 receives a command for controlling the memory device 10 from the application 21, processes the command using the host controller 23, and then may output the processing result thereof to the application 21.

The application 21 and the driver 22 may be implemented, but are not limited to, as software or firmware.

The host controller 23 controls the overall operation inside the host 20. For example, the host controller 23 may transmit data stored in the buffer memory 26 to the memory device 10 through the host interface 24 in response to the write command received from the driver 22. Further, the host controller 23 may also receive data from the memory device 10 through the host interface 24 in response to the read command received from the driver 22.

The buffer memory 26 may be used as a main memory of the host 20, or may be used as a cache memory or a temporary memory for temporarily storing the data. The buffer memory 26 may also be used as a driving memory for driving software such as the applications 21 and the driver 22. The buffer memory 26 may include, but is not limited to, a volatile memory such as a DRAM (Dynamic Random Access Memory).

The host interface 24 may send and receive data to and from the memory device interface 14 of the memory device 10 through data lines DIN and DOUT. The data lines DIN and DOUT may be connected between the host 20 and the memory device 10 by connecting the host connector and the memory device connector. A detailed description of a connection structure of the host connector and the memory device will be explained later.

The memory device 10 may include a memory device interface 14, a memory controller 13, a memory 15, and buffer memory 16. The memory device 10 may be connected to the host 20 through the memory device interface 14.

The memory controller 13 may perform operations of writing, reading or erasing the data requested by the host 20 on the memory 15.

The buffer memory 16 may be used to temporarily store the data to be stored in the memory 15 and the data read from the memory 15. The buffer memory 16 may include, but is not limited to, a volatile memory such as a DRAM (Dynamic Random Access Memory).

The memory 15 may include a non-volatile memory such as a flash memory, an MRAM (Magnetoresistive Random Access Memory), a PRAM (Phase-change Random Access Memory), and a FeRAM (Ferroelectric Random Access Memory). Although the following embodiment shows an example in which the memory device 10 is an SSD (Solid State Drive) including a flash memory, the applicable embodiments are not limited thereto.

The aforementioned memory system may be built in or installed inside various electronic devices. The electronic devices are devices that include electronic equipment and electronic components, and may include, for example, a desktop PC, a tablet PC, a laptop PC, a netbook computer, a workstation, a server, a PDA, a mobile phone, a smartphone, a video phone, an electronic book reader, a MP3 player, a digital camera, a TV, a projector, a game console, a navigation device, a robot, a global navigation satellite system (GNSS), as well as medical equipment including electronic equipment, a washing machine, a refrigerator and the like. Further, in the case of an automobile, a drone, an aircraft, a ship, a satellite and the like, a device may also be called an electronic device as long as it includes electronic equipment or electronic components.

Figure 2:
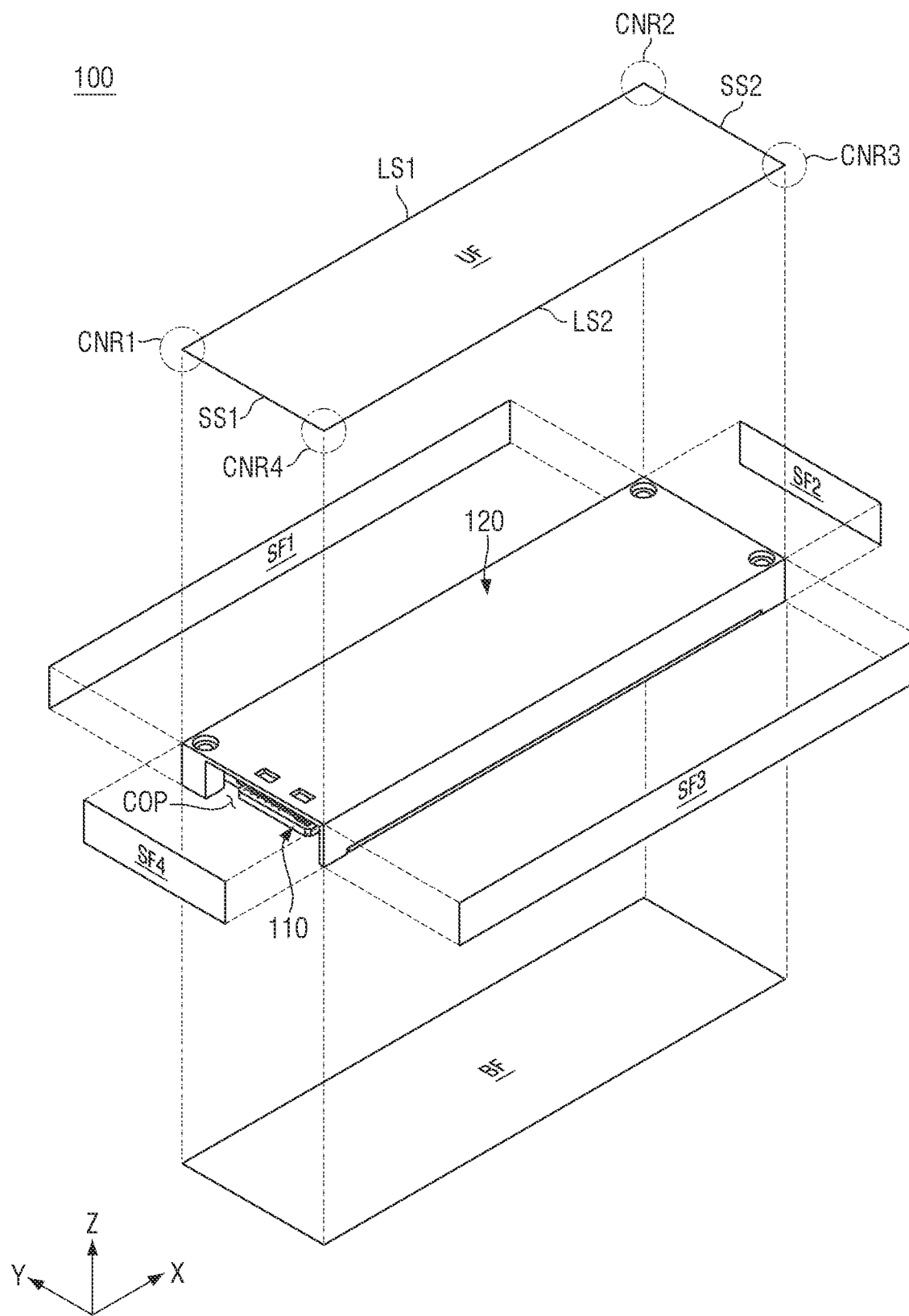
FIG. 2 is a perspective view of a memory device according to an embodiment.
Figure 3:
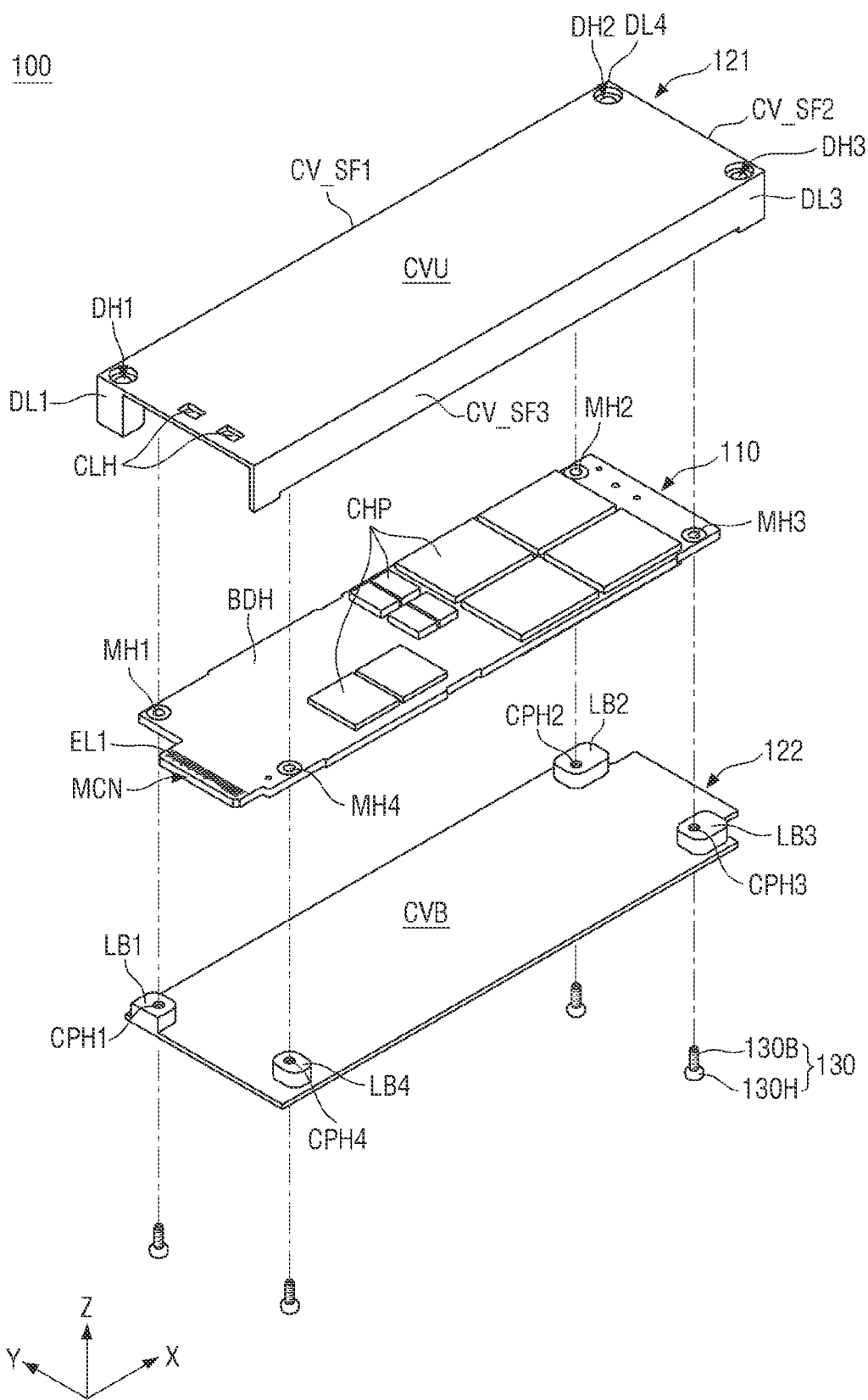
FIG. 3 is an exploded perspective view of the memory device according to an embodiment.
Figure 4:
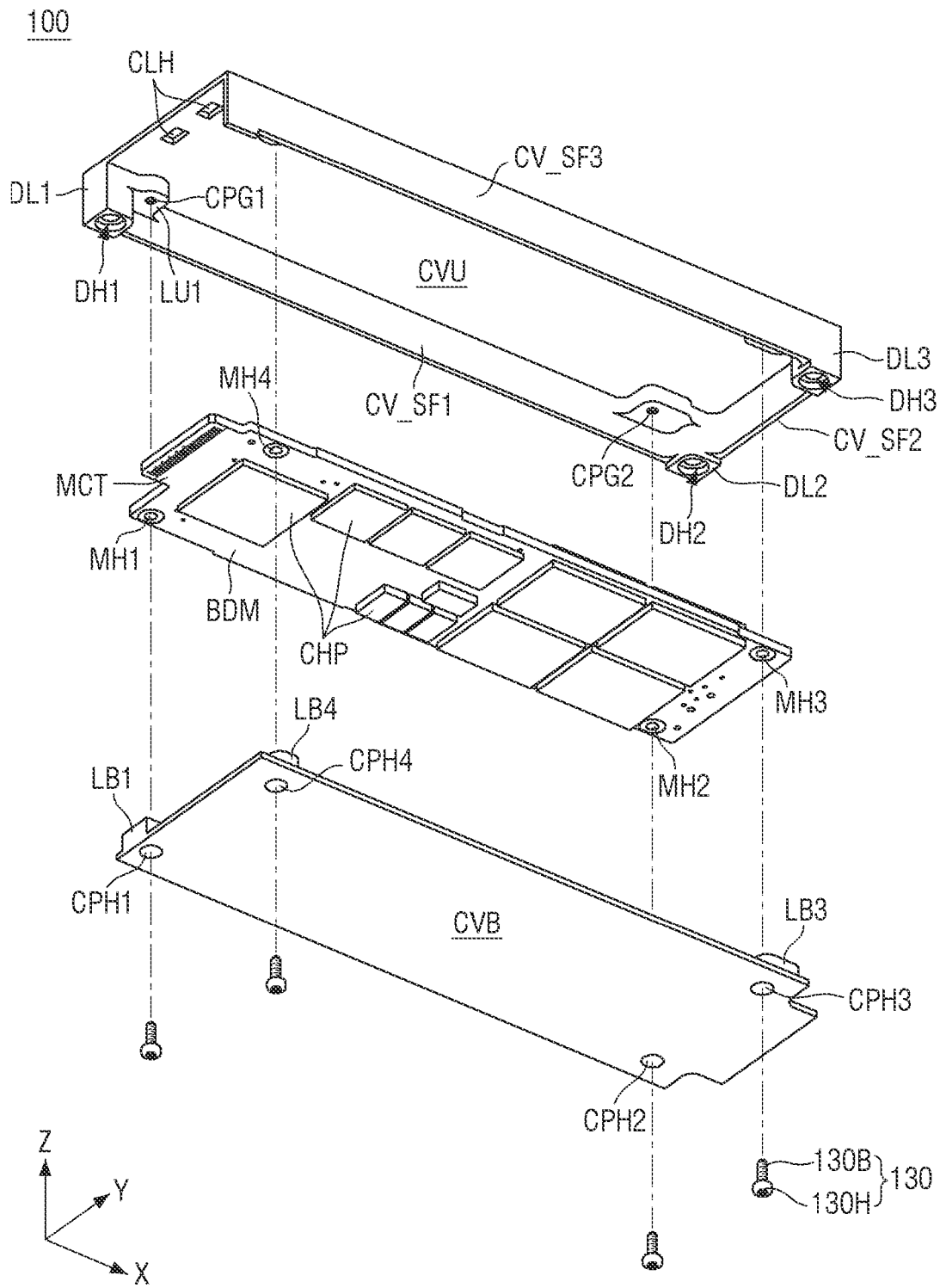
FIG. 4 is an exploded perspective view of the memory device according to the embodiment as viewed from a direction different from FIG. 3.
Figure 5:
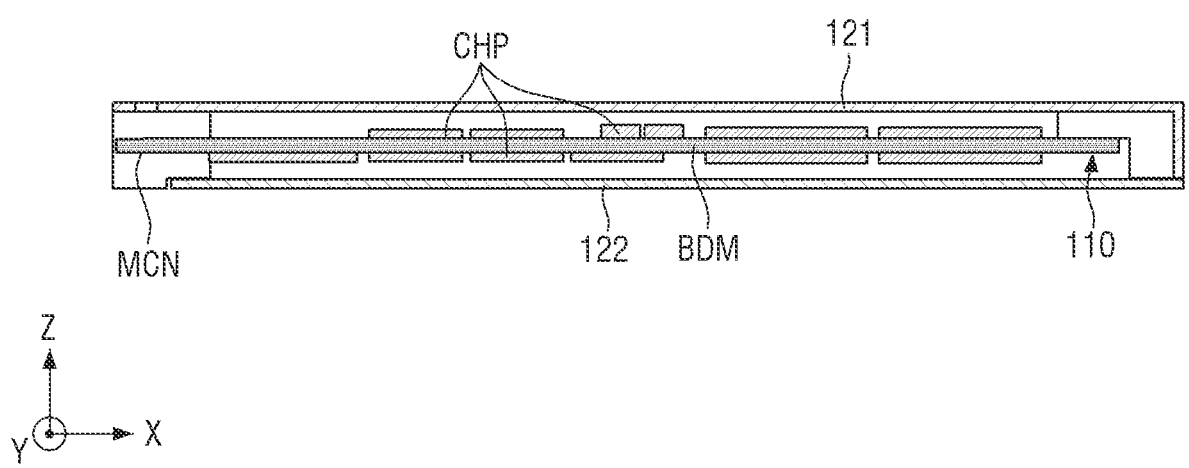
FIG. 5 is a cross-sectional view of the memory device of FIG. 2 taken along a first direction.
Figure 6:
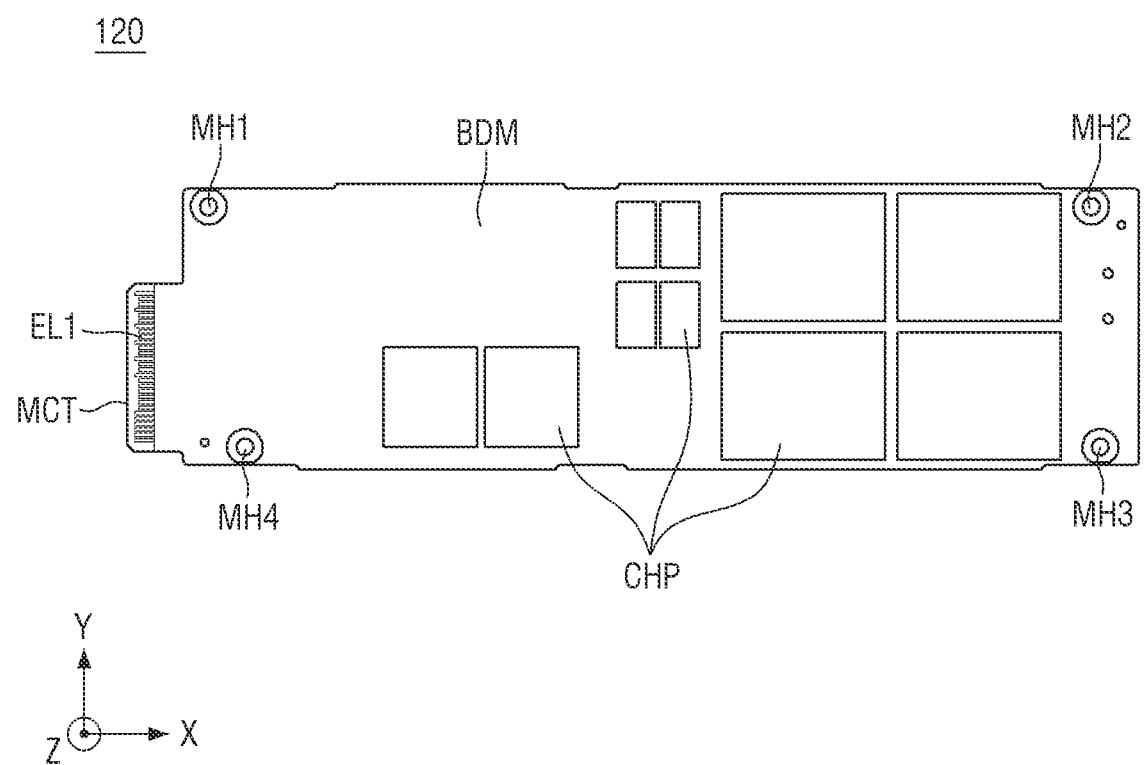
FIG. 6 is a plan view of a memory module according to an embodiment.
Figure 7:
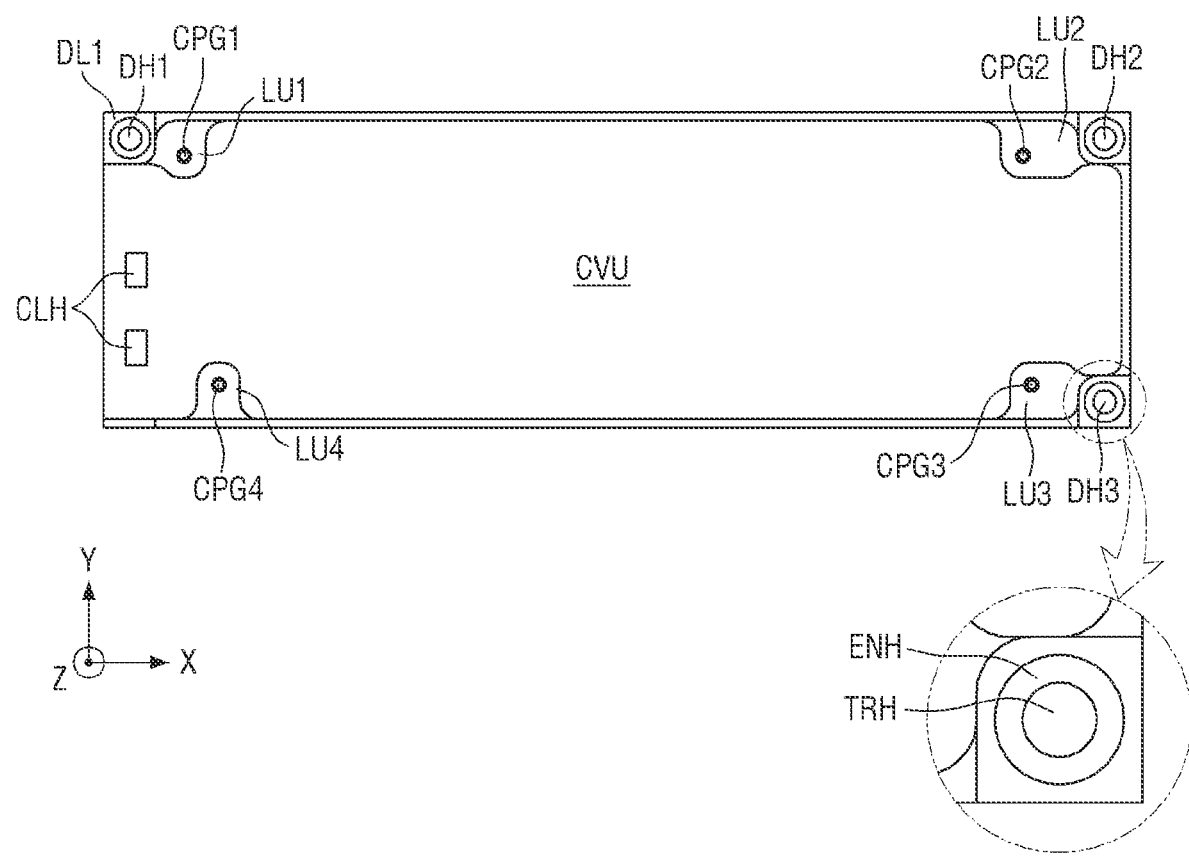
FIG. 7 is a bottom view of a first enclosure according to an embodiment.
Figure 8:
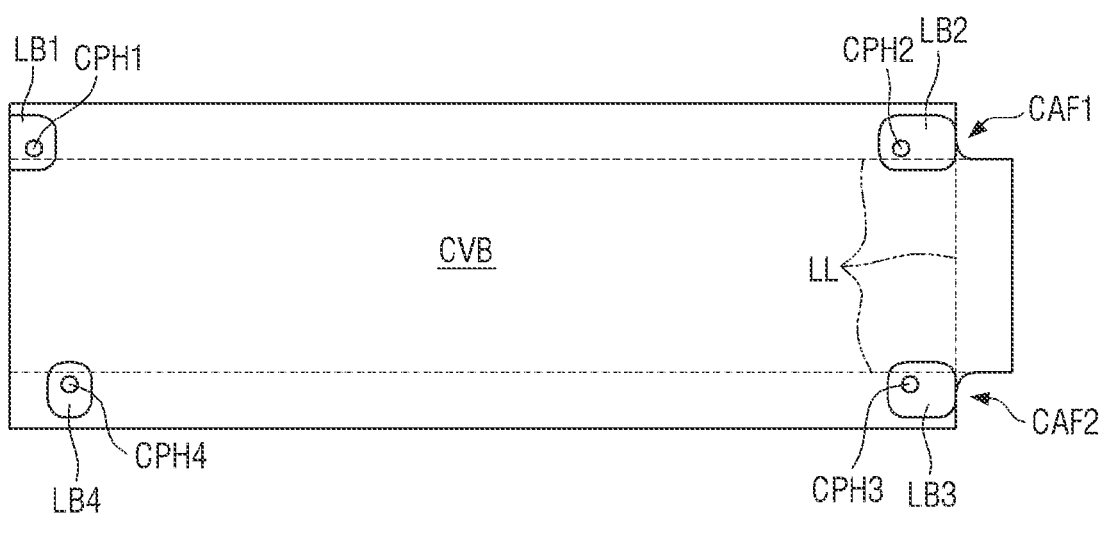
FIG. 8 is a plan view of a second enclosure according to an embodiment.
Figure 8:
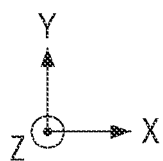

FIG. 2 is a perspective view of a memory device 100 according to an embodiment. FIG. 3 is an exploded perspective view of the memory device 100 according to an embodiment. FIG. 4 is an exploded perspective view of the memory device 100 according to an embodiment as viewed from a direction different from FIG. 3. FIG. 5 is a cross-sectional view of the memory device of FIG. 2 taken along a first direction. FIG. 6 is a plan view of the memory module according to an embodiment. FIG. 7 is a bottom view of a first enclosure according to an embodiment. FIG. 8 is a plan view of a second enclosure according to an embodiment.

Referring to FIG. 2, in the shown embodiment, the memory device 100 has a substantially rectangular parallelepiped shape. If a face having the largest area in the rectangular parallelepiped is defined as a lower face BF, the bottom face of the memory device 100 may have a rectangular shape. The rectangular shape includes a first long side LS1 and a second long side LS2 opposite to each other, and a first short side SS1 and a second short side SS2 opposite to each other. In the present specification, parts in which each side meets in the rectangular shape are referred to as corners CNR1 to CNR4. Specifically, a part in which the first long side LS1 and the first short side SS1 meet is referred to as a first corner CNR1, and a part in which the first long side LS1 and the second short side SS2 meet is referred to as a second corner CNR2, a part in which the second short side SS2 and the second long side LS2 meet is referred to as a third corner CNR3, and a part in which the second long side LS2 and the first short side SS1 meet is referred to as a fourth corner CNR4.

In the drawings, an extension direction of the long side of the bottom face having a rectangular shape is indicated by a first direction X, an extension direction of the short side is indicated by a second direction Y, and a thickness direction of the rectangular parallelepiped is indicated by a third direction Z. Planes defined by the two directions may be referred to as a XY plane, an YZ plane, and a ZX plane, respectively. With such a reference, the bottom face of the memory device 100 is placed on the XY plane. Unless otherwise specified herein, a planar shape or an appearance in the plan view of a particular member means a shape in which the particular member is placed on the XY plane.

For convenience of explanation, among the two bottom faces of the memory device 100, a face located on one side (an upper side in the drawing) in the third direction Z is referred to as an upper face UF, and a face located on the other side (a lower side in the drawing) in the third direction Z is referred to as a lower face BF, respectively. Furthermore, for other components, a face located on one side on the basis of the third direction Z will also be referred to as an upper face UF, and a face located on the other side will also be referred to as a lower face BF. However, the terms "upper" and "lower" on the upper face UF and the lower face BF merely distinguish that they are at mutually symmetric positions, and it is obvious that even in the case of the terms referred to as "upper" and "lower", the top and bottom may be reversed according to a change of direction of the memory device 100, or the faces may be located in a left-right direction or a diagonal direction.

The rectangular parallelepiped shape includes four side faces SF1 to SF4 which connect the upper face UF and the lower face BF. In the present specification, the four side faces of the rectangular parallelepiped may be dividedly referred to as a first side face SF1 connected to the first long side LS1 of the bottom face of the plan view, a second side face SF2 connected to the second short side SS2, a third side face SF3 connected to the second long side LS2, and a fourth side face SF4 connected to the first short side SS1. The upper face UF and the lower face BF of the rectangular parallelepiped are placed on the XY plane, the first side face SF1 and the third side face SF3 are placed on the XZ plane, and the second side face SF2 and the fourth side face SF4 may be placed on the YZ plane. Definitions of directions, faces, corners, and the like mentioned above will be commonly used throughout the specification, even if they are not shown in the drawings.

The appearance of the memory device 100 may follow a standardized or arbitrary form factor. The dimensions of the rectangular parallelepiped memory device 100 are also changeable by various criteria. In an embodiment, the memory device 100 may follow a long type dimensional standard having a long side length (a width in the first direction X) of 119 mm, a short side length (a width in the second direction Y) of 36.5 mm, and a height (a width in the third direction Z) of 9.5 mm. In another embodiment, the memory device 100 may follow a short type dimensional standard having a long side length (a width in the first direction X) of 52 mm, a short side length (a width in the second direction Y) of 36.5 mm, and a height (a width in the third direction Z) of 9.5 mm. The aforementioned dimensional standards may allow tolerances within 5% of each dimension. For example, the aforementioned dimensional standards may allow tolerances such as ±0.25 mm, ±0.35 mm, and ±0.45 mm.

Hereinafter, although a case in which the memory device 100 has a long type dimensional standard will be mainly explained as an example, the technical idea of the embodiments may be modified and applied to a short type dimensional standard or various other dimensional standards.

Referring to FIGS. 2 to 8, the memory device 100 includes a memory module 110, and an enclosure assembly 120 that accommodates the memory module 110. The enclosure assembly 120 may substantially define the appearance of the memory device 100. The memory module 110 may be covered by the enclosure assembly 120, except for some region in which the memory connector MCN is located.

Referring to FIGS. 2 to 5, the memory module 110 may include a module board BDH, a memory connector MCN provided on at least one end of the module board BDH, and an electronic element CHP placed on at least one face of the module board BDH.

The module board BDH may include one or more insulating layers and wiring layers. The module board BDH may include a printed circuit board.

The module board BDH may have a plate-like shape. The module board BDH may be placed approximately on the XY plane. The overall planar shape of the module board BDH may be similar to the planar shape of the memory device 100. For example, if the memory device 100 has a rectangular or similar appearance in a plan view, the module board BDH may also have a rectangular or similar appearance.

The size of the module board BDH in the plan view is smaller than the size of the memory device 100, but it may be approximated to the size of the memory device 100. For example, in the area occupied by the memory device 100, the area occupied by the module board BDH may be in the range of 50% to 99%.

The module board BDH occupies the central part of the memory device 100 in the plan view, and each side of the module board BDH may be located on the inside from each corresponding side of the memory device 100 (i.e., each side of the module board BDH is spaced inwardly from the corresponding sides of the memory device 100). Except for some sections, the enclosure assembly 120 is placed outside the module board BDH in the space between each side of the module board BDH and each side of the memory device 100 to prevent exposure of the module board BDH to the outside.

The module board BDH may include one or more module fastening holes MH1 to MH4. If there are a plurality of module fastening holes MH1 to MH4, each module fastening holes MH1 to MH4 may have the same size and shape, but is not limited thereto.

The module fastening holes MH1 to MH4 penetrate the module board BDH in the third direction Z (the thickness direction). The module fastening holes MH1 to MH4 provide a space into which fastening members such as screws or, bolts (i.e., any type of threaded fastener) are inserted. Hereinafter, although a screw is provided as an example of the fastening member, it is obvious that various types of fastening members may be utilized.

The module fastening holes MH1 to MH4 may be placed at the corners CNR1 to CNR4 of the module board BDH. The module fastening holes MH1 to MH4 may include a first module fastening hole MH1 placed at the first corner CNR1, a second module fastening hole MH2 placed at the second corner CNR2, a third module fastening hole MH3 placed at the third corner CNR3, and a fourth module fastening hole MH3 placed at the fourth corner CNR4. However, the present disclosure is not limited thereto, the module fastening holes MH1 to MH4 may be omitted at some corners, and may be further installed in regions (for example, a central part and a region adjacent to the side) other than the corners.

The positions of each of the module fastening holes MH1 to MH4 based on the corners of each of the corners CNR1 to CNR4 can be variously deformed.

In an embodiment, the positions of each of the module fastening holes MH1 to MH4 may be designed such that distances spaced in the first direction X and the distances spaced in the second direction Y are equal to each other on the basis of the corners of each corner parts CNR1 to CNR4 to provide efficient coupling force. In such an embodiment, if each corner of the module board BDH is located at the apex of one rectangle, a figure obtained by connecting each of the module fastening holes MH1 to MH4 defines a rectangle.

In another embodiment, each of the module fastening holes MH1 to MH4 may be re-located from the above-mentioned positions depending on the wiring design of the module board BDH, the chip arrangement, the position of the memory connector MCN, and the like. For example, as shown in the drawing, when the memory connector MCN is placed on the first short side SS1 to be generally biased to the second long side LS2 further than the first long side LS1, the fourth module fastening hole MH3 placed at the fourth corner CNR4 may be further spaced apart from the first short side SS1 in the first direction X than the first module fastening hole MH1 placed at the first corner CNR1. In this case, a straight line which connects the first module fastening hole MH1 and the fourth module fastening hole MH3 may be inclined at a first angle θ1 with respect to the second direction Y.

In the case of the second module fastening hole MH2 and the third module fastening hole MH3 placed near the second short side SS2 on which the memory connector MCN is not located, although the distance spaced from the second short side SS2 in the first direction X may be the same, by designing the spaced distance of the second module fastening hole MH2 to be greater than the spaced distance of the third module fastening hole MH3, it is also possible to alleviate a spaced distance deviation in the first direction X between the module fastening holes MH1 to MH4. In this case, the straight line which connects the second module fastening hole MH2 and the third module fastening hole MH3 may be inclined at a second angle θ2 with respect to the second direction Y. The second angle θ2 may have the same sign as the first angle θ1. The second angle θ2 may have a smaller absolute value than the first angle θ1, but is not limited thereto. In an embodiment, the figure obtained by connecting each of the module fastening holes MH1 to MH4 may define a trapezoid.

The module fastening holes MH1 to MH4 may have a closed curved shape such as a circle in the plan view. In this case, all the module fastening holes MH1 to MH4 are completely surrounded by the module board BDH in the plan view. As another example, some of the module fastening holes MH1 to MH4 may also be opened to the side (e.g., the long side) of the module board BDH. That is, since the module fastening holes MH1 to MH4 are placed to be closer to the side of the module board BDH, and the side of the module board BDH is placed inside a virtual circle formed by the module fastening holes MH1 to MH4, the module fastening holes MH1 to MH4 do not complete a circular closed curve shape, and may be opened to the side of the module board BDH in the horizontal direction. Also in this case, the width opened to the side of the module board BDH may be smaller than the diameter of the virtual circle.

A memory connector MCN may be placed at one end portion of the module board BDH. In the illustrated embodiment, the memory connector MCN is connected to the first short side SS1 of the module board BDH and protrudes outward in the first direction X from the first short side SS1 of the module board BDH. However, the embodiment is not limited thereto, and the memory connector MCN may be placed on other sides or on a plurality of sides of the module board BDH.

In an embodiment, the width of the memory connector MCN in the second direction Y may be smaller than the width of the module board BDH in the second direction Y. Further, the memory connector MCN may be placed to be spaced apart from the extension line of the first long side LS1 and/or the extension line of the second long side LS2 of the module board BDH. The memory connector MCN may be generally placed to be biased to the first long side LS1 further than the second long side LS2. That is, the distance between the memory connector MCN and the extension line of the first long side LS1 of the module board BDH may be smaller than the distance between the memory connector MCN and the extension line of the second long side LS2 of the module board BDH. However, the embodiment is not limited thereto, and the memory connector MCN may be located at equal distance from the long sides of the module board BDH.

The memory connector MCN is connected to the module board BDH. Although the memory connector MCN may be provided as a separate component from the module board BDH and attached to the module board BDH, it may also be provided integrally with the module board BDH. When the memory connector MCN is provided integrally with the module board BDH, the memory connector MCN may be provided in the module board BDH protruding region in which a part of the module board BDH protrudes outward.

The memory connector MCN may include a plurality of connection terminals EL1. The plurality of connection terminals EL1 may be arranged to be spaced apart along the second direction Y. Each connection terminal EL1 of the memory connector MCN may be connected to each connection terminal EL1 of the corresponding host connector 200. A detailed explanation of the connection between the memory connector MCN and the host connector 200 is provided below.

Each connection terminal EL1 of the memory connector MCN may be connected to the wiring of the module board BDH. When the memory connector MCN is provided integrally with the module board BDH, the connection terminal EL1 of the memory connector MCN may be formed on the same layer, using the same material as the wiring of the module board BDH. Each connection terminal EL1 may have a shape of a pad electrode having a width wider than the wiring of the module board BDH. The plurality of connection terminals EL1 may be exposed to the outside, while at least partially not being covered with the insulating layer. The plurality of connection terminals EL1 may be placed on the upper face UF of the memory connector MCN, and may be placed on the lower face BF. In some cases, the plurality of connection terminals EL1 may be placed on both the upper and bottom faces BF of the memory connector MCN. Furthermore, the memory connector MCN includes a plurality of layers separated in the thickness direction, and a plurality of connection terminals EL1 may be placed on at least one face of each layer.

The size, shape and position of the memory connector MCN, the arrangement of connection terminals ELL and the like may follow various standards. For example, the size, shape and position of the memory connector MCN, the arrangement of connection terminals EL1 and the like may correspond to standards such as E1.S, M.2, and NF2.

An electronic element CHP is placed on the upper face UF and/or the lower face BF of the module board BDH. The electronic element CHP may be manufactured in a chip form separate from the module board BDH and mounted on the module board BDH.

The electronic element CHP may include semiconductor elements. The semiconductor elements may include a memory such as a NAND flash memory or a DRAM memory, and a memory controller that controls the memory. The electronic element CHP may further include a capacitor element. Each electronic element CHP may be connected to the wiring of the module board BDH to perform an electrical operation. The plurality of electronic elements CHP may be spaced apart from each other. A horizontal gap may be defined in the space between each of the electronic elements CHP. The horizontal gap may be filled with air or the like.

Referring to FIGS. 2 to 4, the enclosure assembly 120 generally has a rectangular parallelepiped shape with an empty interior. A memory module 110 is accommodated inside the enclosure assembly 120. The enclosure assembly 120 may act as a housing.

The enclosure assembly 120 may include an upper face UF, a lower face BF and three side faces SF1, SF2 and SF3, as illustrated. The upper face UF and the lower face BF of the enclosure assembly 120 constitutes the upper face UF and the lower face BF of the memory device 100, and the three side faces may each constitute a first side face SF1, a second side face SF2 and a third side face SF3 of the memory devices 100. At a position corresponding to the fourth side face SF4 of the memory device 100, the enclosure assembly 120 may include a connector opening COP that exposes the memory connector MCN in the first direction X.

The enclosure assembly 120 may be provided by assembling a plurality of components. Specifically, the enclosure assembly 120 may include a first enclosure 121 located at the top and a second enclosure 122 located at the bottom. The first enclosure 121 and the second enclosure 122 may be fastened together to define a space that is at least partially sealed. The memory module 110 may be accommodated in the sealed space.

The first enclosure 121 and the second enclosure 122 are made of metals such as stainless steel, aluminum (Al), copper (Cu), titanium (Ti), nickel (Ni) or an alloy containing them, or may be made of a polymer material, a carbon-based material or a composite material thereof.

In some embodiments, the first enclosure 121 and the second enclosure 122 may include a thermal interface material (TIM), a phase change material (PCM) or an encapsulated PCM (ePCM). The above-mentioned materials may be mixed with the constituent materials of the first enclosure 121 and the second enclosure 122, may be coated on an inner face (the lower face BF in the case of the first enclosure 121, and the upper face UF in the case of the second enclosure 122) of the first enclosure 121 and the second enclosure 122 or on both faces, and may be manufactured from separate film or the like and attached to the inner face or both faces of the first enclosure 121 and the second enclosure 122. Such a thermal interface material or the like may help the first enclosure 121 and the second enclosure 122 to absorb, store or spread heat. The heat capacity of the enclosure assembly 120 and the memory device 100 including the same may be increased accordingly.

The materials of the first enclosure 121 and the second enclosure 122 may be the same or may be different from each other.

The first enclosure 121 and the second enclosure 122 may each include a lower face cover corresponding to the bottom face of the enclosure assembly 120. At least one of the first enclosure 121 and the second enclosure 122 may further include a side cover corresponding to the side face of the enclosure assembly 120. Although the illustrated first enclosure 121 includes a lower face cover and a plurality of side covers, the plurality of side covers may also be included in the second enclosure 122. Also, some side covers may be included in the first enclosure 121, and some other side covers may be included in the second enclosure 122.

Referring to FIGS. 2 to 5 and 7, the first enclosure 121 includes a first main cover CVU which is an upper face UF cover, and a plurality of side covers CV_SF1, CV_SF2, and CV_SF3.

The first main cover CVU is placed on the XY plane. The first main cover CVU may have a uniform thickness.

The first main cover CVU may have a substantially rectangular shape in a plan view. A planar shape of the first main cover CVU may be substantially identical to a planar shape of the memory device 100. Lengths of the long side and the short side of the memory device 100 may be determined by lengths of the long side and the short side of the first main cover CVU, respectively.

The first main cover CVU may cover not only the module board BDH of the memory module 110 but also the memory connector MCN of the memory module 110. The first short side SS1 of the first main cover CVU may be arranged at the end portion of the memory connector MCN or may be placed at the outside thereof.

The plurality of side covers may be formed integrally by being connected to the first main cover CVU. The plurality of side covers may include a first side cover CV_SF1 that extends downward from the first long side LS1 of the first main cover CVU, a second side cover CV_SF2 that extends downward from the second short side SS2, and a third side cover CV_SF3 that extends downward from the second long side LS2. A side cover is not present on the first short side SS1 side of the first main cover CVU, thereby defining the connector opening COP. Adjacent side covers CV_SF1, CV_SF2 and CV_SF3 may be connected integrally with each other.

Although each of the side covers CV_SF1, CV_SF2 and CV_SF3 may have the same thickness and may also have the same thickness as the first main cover CVU, the embodiment is not limited thereto.

The side covers CV_SF1, CV_SF2 and CV_SF3 may have a height corresponding to the height of the memory device 100. In the assembled memory device 100 according to the exemplary embodiment, the end portions of the side covers CV_SF1, CV_SF2 and CV_SF3 are placed on the upper face UF of the second main cover CVB of the second enclosure 122, which is a lower face cover. In this case, the height of the memory device 100 may correspond to the sum of the height of the side cover and the thickness of the second main cover CVB.

The heights of the first side cover CV_SF1, the second side cover CV_SF2 and the third side cover CV_SF3 may be generally the same. However, the third side cover CV_SF3 has an end portion protruding from the fourth corner CNR4 in which the inter-device fastening pillars DL1 to DL3 are not placed, and may partially have the same height as the inter-device fastening pillars DL1 to DL3.

The first enclosure 121 may include coupling grooves CPG1 to CPG4 that are spatially connected to the module fastening holes MH1 to MH4 and fastened by a module screw (i.e., threaded fastener) 130. The coupling grooves CPG1 to CPG4 of the first enclosure 121 may be arranged in the same number as the module fastening holes MH1 to MH4. The coupling grooves CPG1 to CPG4 of the first enclosure 121 may overlap the corresponding module fastening holes MH1 to MH4. Although the planar shapes of the coupling grooves CPG1 to CPG4 of the first enclosure 121 and the module fastening holes MH1 to MH4 may be the same, the embodiment is not limited thereto.

The first enclosure 121 may include a top fastening pillar in which the coupling grooves CPG1 to CPG4 are placed. If there are four coupling grooves CPG1 to CPG4, four top fastening pillars may also be provided. That is, the first enclosure 121 has a first top fastening pillar LU1 placed in the first corner CNR1, a second top fastening pillar LU2 placed in the second corner CNR2, a third top fastening pillar LU3 placed at the third corner CNR3, and a fourth top fastening pillar LU4 placed at the fourth corner CNR4, as illustrated in FIG. 7.

The top fastening pillars LU1 to LU4 protrude downward from the lower face BF of the first main cover CVU. In an embodiment, the end portions of the top fastening pillars LU1 to LU4 may come into contact with the upper face UF of the memory module 110 (or the module board BDH). The top fastening pillars LU1 to LU4 may act as a spacer which maintains a gap between the first enclosure 121 and the memory module 110.

The coupling grooves CPG1 to CPG4 are placed in the top fastening pillars LU1 to LU4. The coupling grooves CPG1 to CPG4 may have a shape recessed upward from the end portions of the top fastening pillars LU1 to LU4. The coupling grooves CPG1 to CPG4 may not penetrate the first main cover CVU. The bottom faces of the coupling grooves CPG1 to CPG4 may have the same height as the lower face BF of the first main cover CVU, but is not limited thereto. When the coupling grooves CPG1 to CPG4 are placed inside the top fastening pillars LU1 to LU4 in this way, a contact area with the module screw 130 increases, and fastening strength between the components due to the module screw 130 can be increased.

The top fastening pillars LU1 to LU4 may have, but are not limited to, a polygon shape, such as a square, a rectangle or a rounded rectangle.

The heights of the top fastening pillars LU1 to LU4 may be modified depending on the position and thickness of the memory module 110 placed therein, the height standard of the memory device 100, and the like. The heights of the top fastening pillars LU1 to LU4 may be smaller than the heights of the side covers CV_SF1, CV_SF2 and CV_SF3.

The widths of the top fastening pillars LU1 to LU4 based on the XY plane may be greater than the widths (or thicknesses) of the side covers CV_SF1, CV_SF2 and CV_SF3.

The first enclosure 121 may further include one or more inter-device fastening pillars DL1 to DL3 in which fixed holes DH1 to DH3 are placed, as illustrated in FIG. 4. The inter-device fastening pillars DL1 to DL3 protrude downward from the lower face BF of the first main cover CVU, like the top fastening pillars LU1 to LU4. The widths of the inter-device fastening pillars DL1 to DL3 based on the XY plane may be greater than the widths (or thicknesses) of the side covers CV_SF1, CV_SF2 and CV_SF3. The heights of the inter-device fastening pillars DL1 to DL3 are greater than the heights of the top fastening pillars LU1 to LU4 and may be greater than or equal to the heights of the side covers CV_SF1, CV_SF2 and CV_SF3. The planar shapes of the inter-device fastening pillars DL1 to DL3 may be, but are not limited to, a polygon such as a square, a rectangle or a rounded rectangle.

The inter-device fastening pillars DL1 to DL3 may be placed outside the top fastening pillars LU1 to LU4. There may be a plurality of inter-device fastening pillars DL1 to DL3. The plurality of inter-device fastening pillars may include, for example, a first inter-device fastening pillar DL1 placed outside the first top fastening pillar LU1 at the first corner CNR1, a second inter-device fastening pillar DL2 placed outside the second top fastening pillar LU2 at the second corner CNR2, and a third inter-device fastening pillar DL3 placed outside the third top fastening pillar LU3 at the third corner CRN3. In the case of the fourth corner CNR4 to which the memory connector MCN is placed adjacent, the inter-device fastening pillar may be omitted.

Adjacent side covers, top fastening pillars and/or inter-device fastening pillars may be integrated and connected to each other. For example, at the first corner CNR1, the facing side faces of the first top fastening pillar LU1 and the first inter-device fastening pillar DL1 are interconnected, and the side face facing the first side face SF1 may be connected to the first side cover CV_SF1. Also, at the second corner CNR2, the facing side faces of the second top fastening pillar LU2 and the second inter-device fastening pillar DL2 are interconnected, the second top fastening pillar LU2 is connected to the first side cover CV_SF1, and the second inter-device fastening pillar DL2 may be connected to the first side cover CV_SF1 and the second side cover CV_SF2. Also, at the third corner CNR3, the facing side faces of the third top fastening pillar LU3 and the third inter-device fastening pillar DL3 are interconnected, the third top fastening pillar LU3 is connected to the third side cover CV_SF3, and the second inter-device fastening pillar DL2 may be connected to the third side cover CV_SF3 and the second side cover CV_SF2. Further, at the fourth corner CNR4, the fourth top fastening pillar LU4 may be connected to the third side cover CV_SF3.

Each of the inter-device fastening pillars DL1 to DL3 may include fixed holes DH1 to DH3 therein, as illustrated in FIG. 4. The fixed holes DH1 to DH3 penetrate the inter-device fastening pillars DL1 to DL3 in the third direction Z. Hole depths of the fixed holes DH1 to DH3 may be the same as the heights of the inter-device fastening pillars DL1 to DL3. Ends of the fixed holes DH1 to DH3 may be opened at the end portions of the inter-device fastening pillars DL1 to DL3, and the other ends of the fixed holes DH1 to DH3 may be opened on the upper face UF of the first main cover CVU.

The fixed holes DH1 to DH3 may include a penetration hole TRH placed at the central part and an expansion hole ENH placed at both ends on the basis of the third direction Z. The penetration hole TRH and the expansion hole ENH may be spatially interconnected, as illustrated in FIG. 7.

The penetration hole TRH and the expansion hole ENH may each have a circular shape in the plan view. The expansion hole ENH has an inner diameter larger than that of the penetration hole TRH, and may be placed inside the expansion hole ENH in the plan view. The planar shape of the penetration hole TRH and the planar shape of the expansion hole ENH may be in a concentric relationship.

In an embodiment, an inner diameter of the penetration hole TRH may be 2.7 mm. The center of the penetration hole TRH may be spaced apart by 3.0 mm from the adjacent side of the first main cover CVU. For example, the center of the penetration hole TRH of the coupling holes CPH1 to CPH4 placed at the first corner CNR1 of the first main cover CVU may be spaced apart by 3.0 mm from each of the first long side LS1 and the second short side SS2.

At a boundary between the penetration hole TRH and the extension hole ENH, the extension hole ENH may include a bottom face placed on the XY plane. The bottom face of the expansion hole ENH may function as a head settlement part on which the head 330H of the device screw 330 is settled.

A spiral (i.e., mechanical threads) may be formed on the inner wall of the penetration hole TRH. Even in this case, the spiral may not be placed on the inner wall of the expansion hole ENH.

The expansion hole ENH may include a first expansion hole ("ENH1" of FIG. 16) placed above the penetration hole TRH, and a second expansion hole ("ENH2" of FIG. 16) placed below the penetration hole TRH. The first expansion hole ENH1 and the second expansion hole ENH2 may be in a symmetrical relationship. The first expansion hole ENH1 and the second expansion hole ENH2 may have the same inner diameter and height, but are not limited thereto.

The fixed holes DH1 to DH3 having the aforementioned structure may contribute to freeing the fixing process of the memory device 100. Specifically, the memory device 100 may be fixed to a host or electronic device having a screw accommodation hole ("400H" of FIG. 15) through the device screw 330. If the screw accommodation hole 400H is placed below the memory device 100, in some cases, the device screw 330 may need to be inserted from above and, in other cases, may need to be inserted from below. The fixed holes DH1 to DH3 allow both the upward and downward insertion of the device screw 330, and the first expansion hole ENH1 and the second expansion hole ENH2 provided at both ends of the fixed holes DH1 to DH3 provide a settlement space of the screw head 330H for both the upward and downward insertion, which may ensure a secure fixation (i.e., the screw head 330H can be countersunk within the fixed holes DH1 to DH3). Non-explained reference numeral "330B" indicates a body of the device screw.

The first enclosure 121 may further include at least one clamping hole CLH penetrating the first main cover CVU, as illustrated in FIG. 3. The clamping hole CLH provides a space for a hook 211 of the host connector 200 (FIG. 9) to be inserted when connected to the host connector 200. The clamping hole CLH may be positioned so as to be adjacent to the first short side SS1 of the first main cover CVU.

The clamping hole CLH may be located at a position overlapping the memory connector MCN. The clamping hole CLH may have a rectangular shape in which the second direction Y is a long side in the plan view. In an embodiment, the width of the clamping hole CLH in the second direction Y may be 4.0 mm, and the width in the first direction X may be 2.5 mm, although other dimensions are possible.

The number of clamping holes CLH may correspond to the number of hooks 211 on the host connector 200. If the host connector 200 includes two hooks 211, there may also be two clamping holes CLH. The plurality of clamping holes CLH may be arranged along the second direction Y. In an embodiment, one clamping hole CLH is placed to be spaced by 7.25 mm from the second long side LS2 of the first main cover CVU, and the other clamping hole CLH may be placed to be spaced by 16.25 mm. A gap between the clamping holes CLH may be 5.0 mm.

Referring to FIGS. 2 to 5 and 8, the second enclosure 122 includes a second main cover CVB which is a lower face cover.

The second main cover CVB is placed on the XY plane. The second main cover CVB may have the same thickness as the first main cover CVU, but embodiments are not limited thereto.

The second main cover CVB may have an area smaller than that of the first main cover CVU. The second main cover CVB covers the entire module board BDH of the memory module 110 from below, but may be configured to expose the memory connector MCN. The first short side SS1 of the second main cover CVB is placed inside the first short side SS1 of the first main cover CVU, and may be located inside the end portion of the memory connector MCN. The first short side SS1 of the first main cover CVU may be arranged on the first short side SS1 of the module board BDH, but is not limited thereto.

The second main cover CVB may include first and second chamfered parts CAF1 and CAF2 (FIG. 8) formed at each of the second corner CNR2 and third corner CNR3 so as not to interfere with the inter-device fastening pillars DL1 to DL3 of the first enclosure 121 (that is to say, so as not to overlap the inter-device fastening pillars DL1 to DL3 in the third direction Z). The shape of the first chamfered part CAF1 is substantially the same as the shape of the lower face BF of the second inter-device fastening pillar DL2, and the shape of the second chamfered part CAF2 may be substantially the same as the shape of the lower face BF of the third inter-device fastening pillar DL3. As the chamfered parts CAF1 and CAF2 are formed on the second main cover CVB, the first long side LS1, the second long side LS2 and the second short side SS2 of the second main cover CVB may be recognized as a shape protruding from a virtual rectangle LL, as illustrated in FIG. 8. The first long side LS1, the second long side LS2, and the second short side SS2 of the second main cover CVB protruding from the virtual rectangle LL may be arranged on the first long side LS1, the second long side LS2, and the second short side SS2 of the first main cover CVU, respectively.

The second enclosure 122 may include coupling holes CPH1 to CPH4 that are spatially connected to the module fastening holes MH1 to MH4 and fastened by a module screw 130, as illustrated in FIG. 8. The number of coupling holes CPH1 to CPH4 of the second enclosure 122 may correspond to the same number of module fastening holes MH1 to MH4. The coupling holes CPH1 to CPH4 of the second enclosure 122 may overlap the module fastening holes MH1 to MH4 and the coupling grooves CPG1 to CPG4 of the first enclosure 121 corresponding thereto. Although the planar shapes of the coupling holes CPH1 to CPH4 of the second enclosure 122 and the module fastening holes MH1 to MH4 may be the same, embodiments are not limited thereto.

The second enclosure 122 may include bottom fastening pillars LB1 to LB4 in which the coupling holes CPH1 to CPH4 are located, as illustrated in FIG. 3. If there are four coupling holes CPH1 to CPH4, four bottom fastening pillars LB1 to LB4 may also be provided. That is, the first enclosure 121 has a first bottom fastening pillar LB1 placed at the first corner CNR1, a second bottom fastening pillar LB2 placed at the second corner CNR2, a third bottom fastening pillar LB3 placed at the third corner CNR3, and a fourth bottom fastening pillar LB4 placed at the fourth corner CNR4.

The bottom fastening pillars LB1 to LB4 protrude upward from the upper face UF of the second main cover CVB. In an embodiment, the end portions of the bottom fastening pillars LB1 to LB4 may come into contact with the lower face BF of the memory module 110 (or the module board BDH). The bottom fastening pillars LB1 to LB4 may act as a spacer which maintains the gap between the second enclosure 122 and the memory module 110.

The coupling holes CPH1 to CPH4 are placed in the bottom fastening pillars LB1 to LB4. The coupling holes CPH1 to CPH4 may penetrate the bottom fastening pillars LB1 to LB4 in the third direction Z. The coupling holes CPH1 to CPH4 may extend through the fastening pillars LB1 to LB4 so as to be open at the fastening pillars LB1 to LB4 and at the lower face BF of the second bottom part. The coupling holes CPH1 to CPH4 may provide a settlement jaw on which the head 130H of the module screw 130 is settled, by including a hole enlargement part having an enlarged inner diameter at the lower part. When the coupling holes CPH1 to CPH4 are placed inside the bottom fastening pillars LB1 to LB4 in this way, the contact area with the module screw 130 increases, and the fastening strength between the components due to the module screw 130 can be increased.

The bottom fastening pillars LB1 to LB4 may have a polygon shape, such as a square, a rectangle or a rounded rectangle. However, embodiments are not limited to polygon shapes.

The height of the bottom fastening pillars LB1 to LB4 may be deformed depending on the position and thickness of the memory module 110 placed therein, the height standard of the memory device 100, and the like. The height of the bottom fastening pillars LB1 to LB4 may be smaller than the height of the side covers CV_SF1, CV_SF2 and CV_SF3.

The width of the bottom fastening pillars LB1 to LB4 based on the XY plane may be greater than the width (or thickness) of the side covers CV_SF1, CV_SF2 and CV_SF3.

The first enclosure 121, the memory module 110 and the second enclosure 122 may be fastened to each other by module screws 130. Each module screw 130 sequentially passes through a respective one of the coupling holes CPH1 to CPH4 of the second enclosure 122 and the module fastening holes MH1 to MH4 from the lower face BF of the second enclosure 122, and is inserted to the coupling grooves CPG1 to CPG4 of the first enclosure 121 to couple them to each other. Spirals (i.e., mechanical threads) which rotate in the same direction may be placed on the inner walls of the coupling holes CPH1 to CPH4 of the second enclosure 122, the module fastening holes MH1 to MH4 and/or the coupling grooves CPG1 to CPG4 of the first enclosure 121, for smooth fastening with the module screws 130. In the fastened memory device 100, the head 130H of the module screw 130 may be placed below the second enclosure 122, and may also be placed inside the coupling holes CPH1 to CPH4 of the second enclosure 122.

Referring to FIGS. 2 to 8, the memory device 100, when assembled, may have a sealed structure in which the memory module 110 is completely enclosed through the first enclosure 121 and the second enclosure 122, except for the fourth side face SF4 on which the memory connector MCN is placed.

Specifically, the end portion of the first side cover CV_SF1 of the first enclosure 121 may be in contact with the upper face UF of the second main cover CVB on the first long side LS1 side. The side face of the second main cover CVB on the first long side LS1 side constitutes the first side face SF1 of the memory device 100 together with the outer face of the first side cover CV_SF1. Although the side face of the second main cover CVB on the first long side LS1 side and the outer face of the first side cover CV_SF1 are aligned with each other and may be placed on the same XZ plane, the embodiment is not limited thereto.

Further, the end portion of the second side cover CV_SF2 of the first enclosure 121 may be in contact with the upper face UF of the second main cover CVB on the second short side SS2 side. The side face of the second main cover CVB on the second short side SS2 side may constitute the second side face SF2 of the memory device 100 together with the outer face of the second side cover CV_SF2. Although the side face of the second main cover CVB on the second short side SS2 side and the outer side of the second side cover CV_SF2 are aligned with each other and may be placed on the same YZ plane, the embodiment is not limited thereto.

Further, the end portion of the third side cover CV_SF3 of the first enclosure 121 may be in contact with the upper face UF of the second main cover CVB on the second long side LS2 side. The side face of the second main cover CVB on the second long side LS2 side may constitute the third side face SF3 of the memory device 100 together with the outer face of the third side cover CV_SF3. Although the side face of the second main cover CVB on the second long side LS2 side and the outer side of the third side cover CV_SF3 are aligned with each other and may be placed on the same XZ plane, the embodiment is not limited thereto.

The second main cover CVB in the second corner CNR2 and the third corner CNR3 includes a first chamfered part CAF1 and a second chamfered part CAF2, as illustrated in FIG. 8. These first and second chamfered parts CAF1 and CAF2 create respective openings that receive the second inter-device fastening pillar DL2 and the third inter-device fastening pillar DL3 of the first enclosure 121. The two side faces of the first chamfered part CAF1 of the second main cover CVB come into contact with the two side faces of the adjacent second inter-device fastening pillar DL2, and the two side faces of the second chamfered part CAF2 of the second main cover CVB may come into contact with the two side faces of the adjacent third inter-device fastening pillar DL3, respectively. Accordingly, the second corner CNR2 and the third corner CNR3 of the assembled memory device 100 may be sealed.

In the case of the first corner CNR1, an opening in which the second main cover CVB is not placed is provided, and the space is filled with the first inter-device fastening pillar DL1.

The end portions of the first to third inter device fastening pillars DL1 to DL3 may be placed on the same XY plane as the lower face BF of the second main cover CVB.

In the case of the fourth corner CNR4, although there is no inter-device fastening pillars, since the third side cover CV_SF3 has a width corresponding to the width of the first inter-device fastening pillar DL1 and protrudes downward, the overall height may be adjusted. In this case, the end portion of the protruding third side cover CV_SF3 may be placed on the same XY plane as the lower face BF of the second main cover CVB.

Through the fastening structure as described above, the first side face SF1, the second side face SF2, and the third side face SF3 of the memory device 100 may be firmly sealed. The fourth side face SF4 of the memory device 100 may be substantially sealed by a host connector 200 to be described below.

In this way, when the memory device 100 has a sealed structure, the mechanical strength may be increased. When the memory device 100 is applied to mobility-related electronic devices such as automobiles, drones, and aircraft, it may be exposed to shocks such as vibrations, and may be subject to strong external shocks such as vehicle accidents.

However, as the mechanical strength increases through the sealed structure as described above, mechanical reliability may be improved. Furthermore, mobility-related electronic devices may be exposed to the harsh environments specified by USCAR (United States Council for Automotive Research), LV124 (a quality and reliability test standard jointly established by German automotive manufacturers), and the like. In the case of the memory device 100 that is rigidly sealed as in the embodiment, it has excellent moisture-proof and dust-proof characteristics and may show high reliability even in a harsh environment. Further, the sealed structure also has a significant effect in protecting the memory device 100 from EMI, EMC and other electromagnetic waves. Further, in the case of the embodiment, even for the internal chip heat generation, heat dissipation is effectively performed through the sealed structure in which each part is in contact with each other, and when the enclosure assembly 120 includes a thermal interface material or the like, the heat capacity increases, and the DTT entry time of the memory device 100 may be delayed. Further, since the memory device 100 includes the coupling holes CPH1 to CPH4 that may be fastened in upward and downward directions, it may be firmly fixed to the host or the electronic device in various ways. A detailed explanation thereof will be described later.

Hereinafter, a method in which the memory device 100 is fastened to the host connector 200 will be explained. First, the structure of the host connector 200 will be explained.

Figure 9:
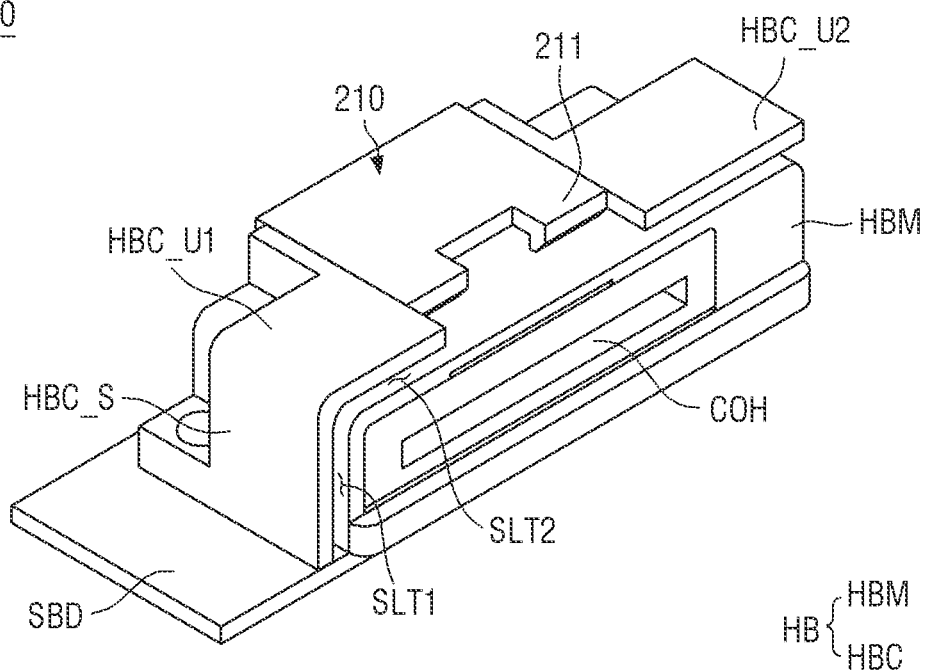
FIG. 9 is a partial perspective view of a host according to an embodiment.
Figure 10:
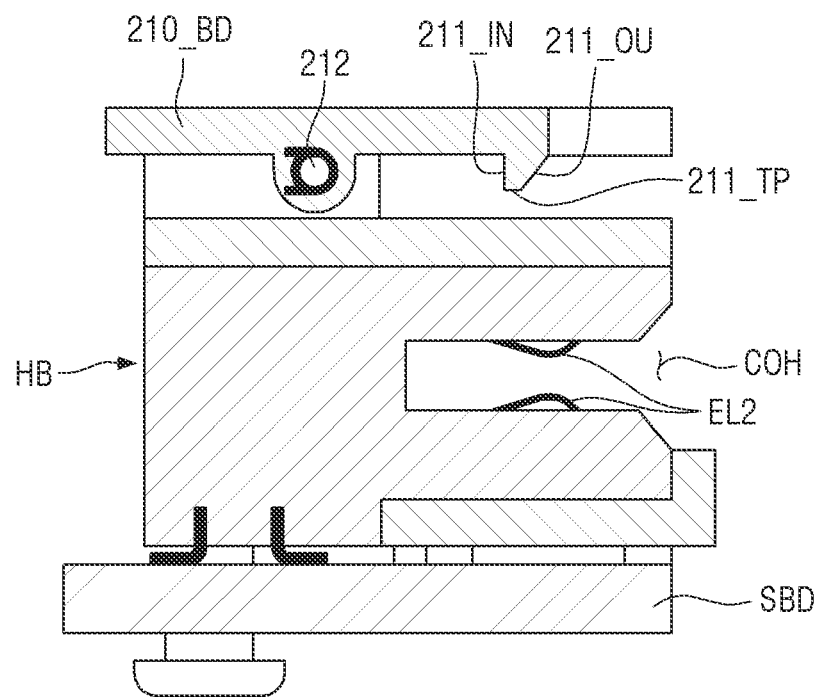
FIG. 10 is a cross-sectional view of FIG. 9.
Figure 11:
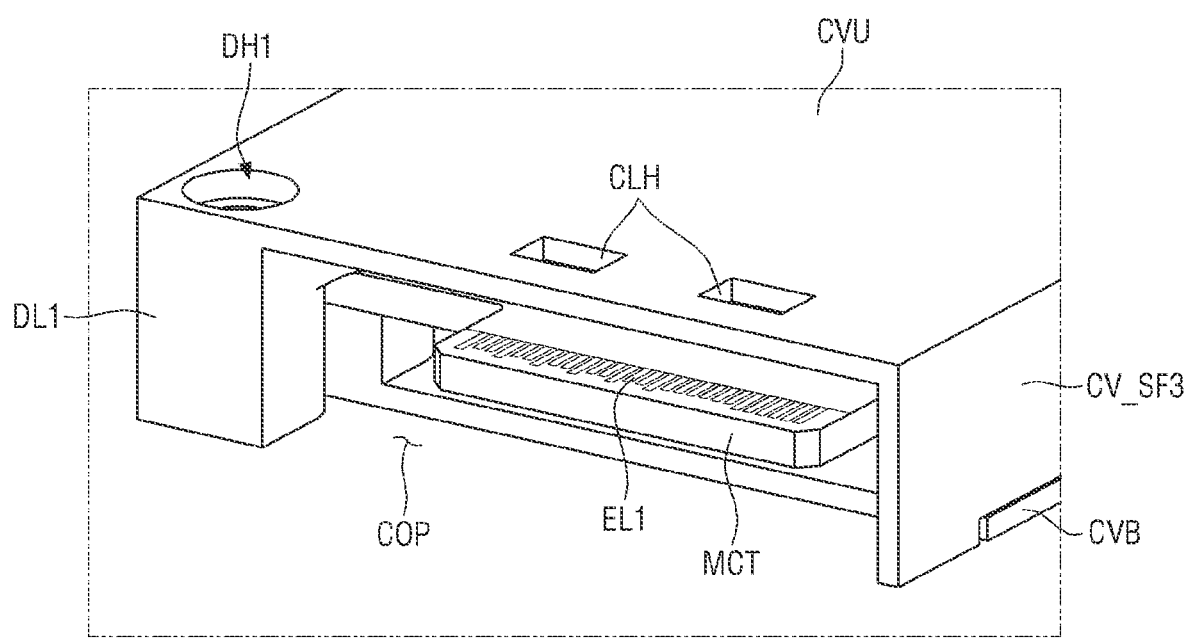
FIG. 11 is a partial perspective view of the memory device according to an embodiment.

FIG. 9 is a partial perspective view of the host according to the embodiment. FIG. 10 is a cross-sectional view of FIG. 9. FIG. 11 is a partial perspective view of the memory device according to the embodiment.

Referring to FIGS. 9 to 11, the host may include a host connector 200 and a system board SBD.

The system board SBD may include a printed circuit board (PCB). The host connector 200 may be fixed to the system board SBD. Although the drawings show a shape in which the host connector 200 is fixed onto the system board SBD through a threaded fastener, the fixing method is not limited to an exemplified method. The host connector 200 and the system board SBD may be electrically connected.

The host connector 200 may include a connector body HB, a plurality of connection terminals EL2 installed in the connector body HB, and a latch 210 installed on the upper face UF of the connector body HB.

The connector body HB may include a main body HBM and a body cover HBC. A connector hole COH which accommodates a memory connector MCN is provided on the front of the main body HBM (one of the side faces, and a facing surface which faces the first side face SF1 of the memory device 100). The main body HBM and the body cover HBC may be at least partially spaced part from each other, and slots SLT1 and SLT2 that accommodate at least a part of the enclosure assembly 120 may be defined, as illustrated in FIG. 9. As will be explained later, the slot may include a side slot part SLT1, and an upper slot part SLT2 that is angled relative to the side slot part SLT1. The side slot part SLT1 and the upper slot part SLT2 are spatially connected. The main body HBM and the body cover HBC may be provided as separate members, then may be fastened together. Alternatively, the main body HBM and the body cover HBC and may be formed integrally.

The connector hole COH is provided on the front (or the facing surface) of the main body HBM. A horizontal width of the connector hole COH is equal to or greater than the horizontal width of the memory connector MCN of the memory device 100 to provide a space capable of accommodating the memory connector MCN. A plurality of connection terminals EL2 may be placed inside the connector hole COH of the memory device 100, as illustrated in FIG. 10. When the memory connector MCN of the memory device 100 is inserted into the connector hole COH, the connection terminal EL1 of the memory connector MCN and the connection terminal EL2 of the host connector 200 are electrically connected to each other, and the memory device 100 and the host may be interconnected. At least some or all of the side faces (the first side face SF1 and the third side face SF3), the upper face UF, and the lower face BF of the memory connector MCN inserted into the connector hole COH for complete air-tightness may come into contact with the inner walls of the connector hole COH, but the embodiment is not limited thereto.

The body cover HBC may include a side cover part HBC_S that covers one outer face of the main body HBM, and upper cover parts HBC_U1 and HBC_U2 that cover the upper face UF of the main body HBM. The side cover part HBC_S and one side face of the main body HBM are spaced by a distance equal to or greater than the thickness of the first side cover CV_SF1 of the first enclosure 121, and constitutes a side slot part SLT1 that accommodates the first side cover CV_SF1. The upper cover parts HBC_U1 and HBC_U2 and the upper face UF of the main body HBM are spaced by a distance equal to or greater than the thickness of the first main cover CVU of the first enclosure 121, and constitutes an upper slot part SLT2 that accommodates the first main cover CVU.

The upper cover part may include a first upper cover part HBC_U1 adjacent to the side cover part HBC_S, and a second upper cover part HBC_U2 located to be spaced apart from the first upper cover part HBC_U1, as illustrated in FIG. 9. The first upper cover part HBC_U1 may be directly connected to the side cover part HBC_S. In the space between the first upper cover part HBC_U1 and the second upper cover part HBC_U2, the upper face UF of the main body HBM may be exposed without being covered by the body cover HBC.

A latch 210 is placed in the space between the first upper cover part HBC_U1 and the second upper cover part HBC_U2. The end portion of the latch 210 may be recessed relative to the end portions of the upper cover parts HBC_U1 and HBC_U2, as illustrated in FIG. 9.

The latch 210 may include a latch body 210_BD, and one or more hooks 211 placed at the end portion of the latch body 210_BD. The number and size of hooks 211 may correspond to the number and size of clamping holes CLH of the memory device 100.

In the plan view, the hook 211 may protrude outward from the end portion of the latch body 210_BD. In the cross-sectional view, the hook 211 may include a tip 211_TP protruding downward, an outer face 211_OU of the tip 211_TP, and an inner face 211_IN of the tip 211_TP. The width of the hook 211 may taper toward the tip 211_TP along the third direction Z, as illustrated in FIG. 10.

In the cross-sectional view, the outer face 211_OU of the hook 211 may have a slope inclined inward toward the tip 211_TP. The cross section of the slope may have a straight line or a convex curve.

In the cross-sectional view, the inner face 211_IN of the hook 211 may have a straight line or a concave curve. An absolute value of an angle formed by the inner face 211_IN of the hook 211 and the hook body 210_BD may be greater than an absolute value of an angle formed by the outer face 211_OU of the hook 211 and the hook body 210_BD.

The latch 210 may be coupled to the connector body HB by a joint 212. The joint 212 may be configured to include a spring. Since the spring has a restoring force, even if the latch 210 is lifted up by an external force, the spring may allow the latch to lower to an original position when the external force is removed.

Figure 12:
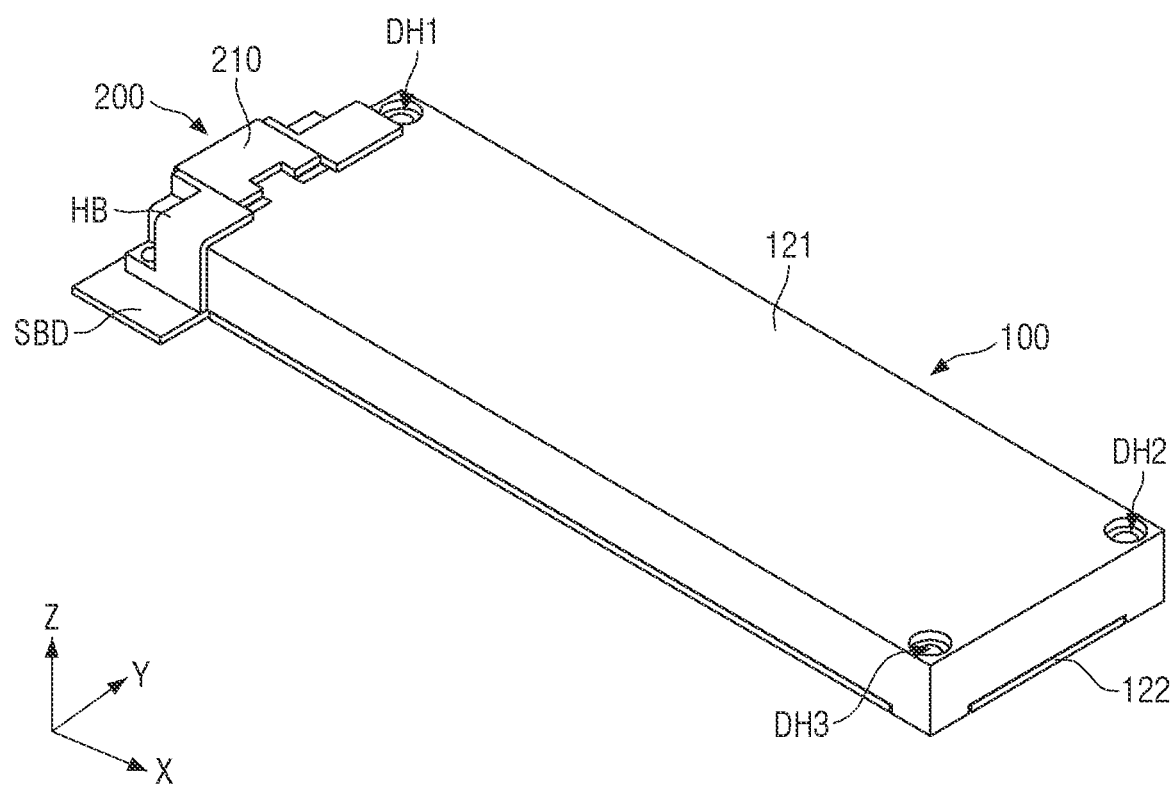
FIG. 12 is a perspective view showing a state in which the memory device is fastened to a host.
Figure 13:
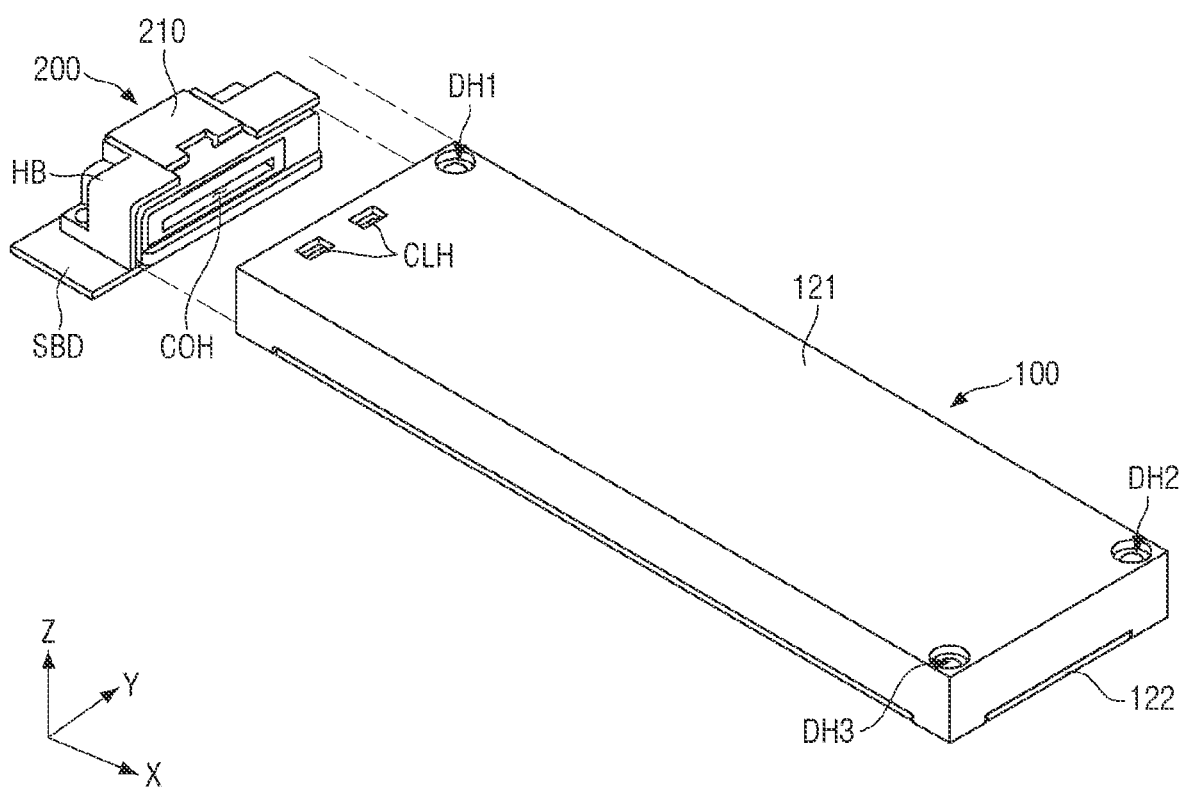
FIG. 13 is a perspective view showing a state before the memory device is fastened to the host.
Figure 14:
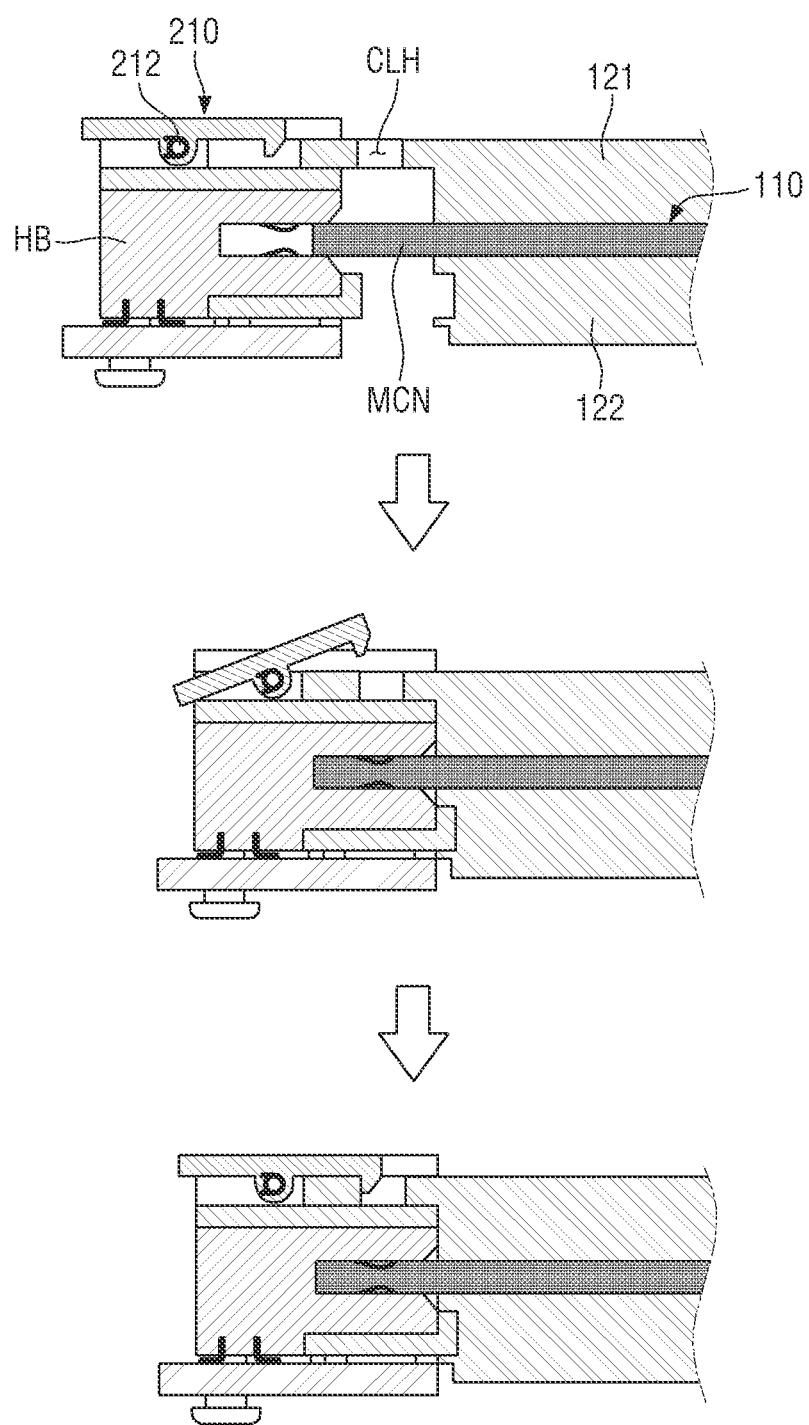
FIG. 14 is a cross-sectional view showing a process of fastening the memory connector to a host connector.

FIG. 12 is a perspective view showing a state in which the memory device is fastened to the host. FIG. 13 is a perspective view showing a state before the memory device is fastened to the host. FIG. 14 is a cross-sectional view showing the process of fastening the memory connector to the host connector.

Referring to FIGS. 12 to 14, the latch 210 of the host connector 200 before being fastened to the memory device 100 is in a state in which the latch body 210_BD is oriented in the horizontal direction and the hook 211 is directed downward. The hook 211 is located at a height lower than the upper face UF of the first main cover CVU of the first enclosure 121 with respect to the memory device 100 to be inserted.

The fourth side face SF4 of the memory device 100 is pushed into the front of the host connector 200 for fastening. At this time, the memory connector MCN is inserted into the inside of the connector hole COH, the third side cover CV_SF3 is inserted to the side slot part SLT1, and the first main cover CVU is inserted into the upper slot part SLT2, respectively. In the fastening process, the side slot part SLT1 and the upper slot part SLT2 may serve to guide the memory device 100 to be inserted in the correct direction.

When the memory device 100 is pushed further, the end portion of the first main cover CVU of the first enclosure 121 located on the first short side SS1 may come into contact with the outer face 211_OU of the hook 211. In this state, when the memory device 100 is pushed further, the hook 211 is automatically lifted up along the slope of the outer face 211_OU by the force. When the tip 211_TP of the hook 211 is lifted up above the upper face UF of the first main cover CVU, the end portion of the first main cover CVU may move further inward. At this time, the end portion of the first main cover CVU no longer comes into contact with the hook 211. The lifted-up hook 211 may be lowered downward by the restoring force of the spring applied to the joint 212. Although the hook 211 receives the restoring force so as to be directed to the lower point, since the upper face UF of the first main cover CVU is located at a position higher than that, the hook 211 is no longer lowered and may be placed on the upper face UF of the first main cover CVU.

Next, when the memory device 100 is pushed further inward, the hook 211 reaches the point at which the clamping hole CLH of the first enclosure 121 is located, the restoring force of the spring applied to the joint 212 acts at that point, and the hook 211 is inserted into the clamping hole CLH. In this state, the connection terminal EL1 of the memory connector MCN and the connection terminal EL2 of the host connector 200 are electrically connected, and the connection is completed.

When the hook 211 is inserted into the clamping hole CLH, the hook 211 restricts movement of the clamping hole CLH in the first direction X. Therefore, mobility of the memory device 100 including the clamping hole CLH in the first direction X may be prevented. Also, an incomplete insertion or an excessive insertion of the memory device 100 is prevented so that the connection terminal EL1 of the memory connector MCN and the connection terminal EL2 of the host connector 200 can be connected at the desired position.

Further, as described above, the third side cover CV_SF3 of the memory device 100 is inserted into the side slot part SLT1, and the first main cover CVU is inserted into the upper slot part SLT2, respectively. The side slot part SLT1 may restrict movement of the memory device 100 in the second direction Y, and the upper slot part SLT2 may restrict movement of the memory device 100 in the third direction Z. Therefore, the memory device 100 may achieve a tight fastening to the host in which movement in the first direction X, the second direction Y, and the third direction Z is restricted.

Meanwhile, the exposed fourth side face SF4 of the memory device 100 and the clamping hole CLH may be completely covered by the connector body HB and the latch 210 through fastening with the host connector 200. The structure in which the memory device 100 is inserted into the slots SLT1 and SLT2 of the connector body HB may help not only prevent movement, but also form a substantially sealed structure. Since the sealed structure of such a memory system is advantageous in terms of impact resistance, dust resistance, moisture resistance, heat capacity expansion, electromagnetic wave shielding, and the like as explained above, repeated explanation will not be provided.

Figure 15:
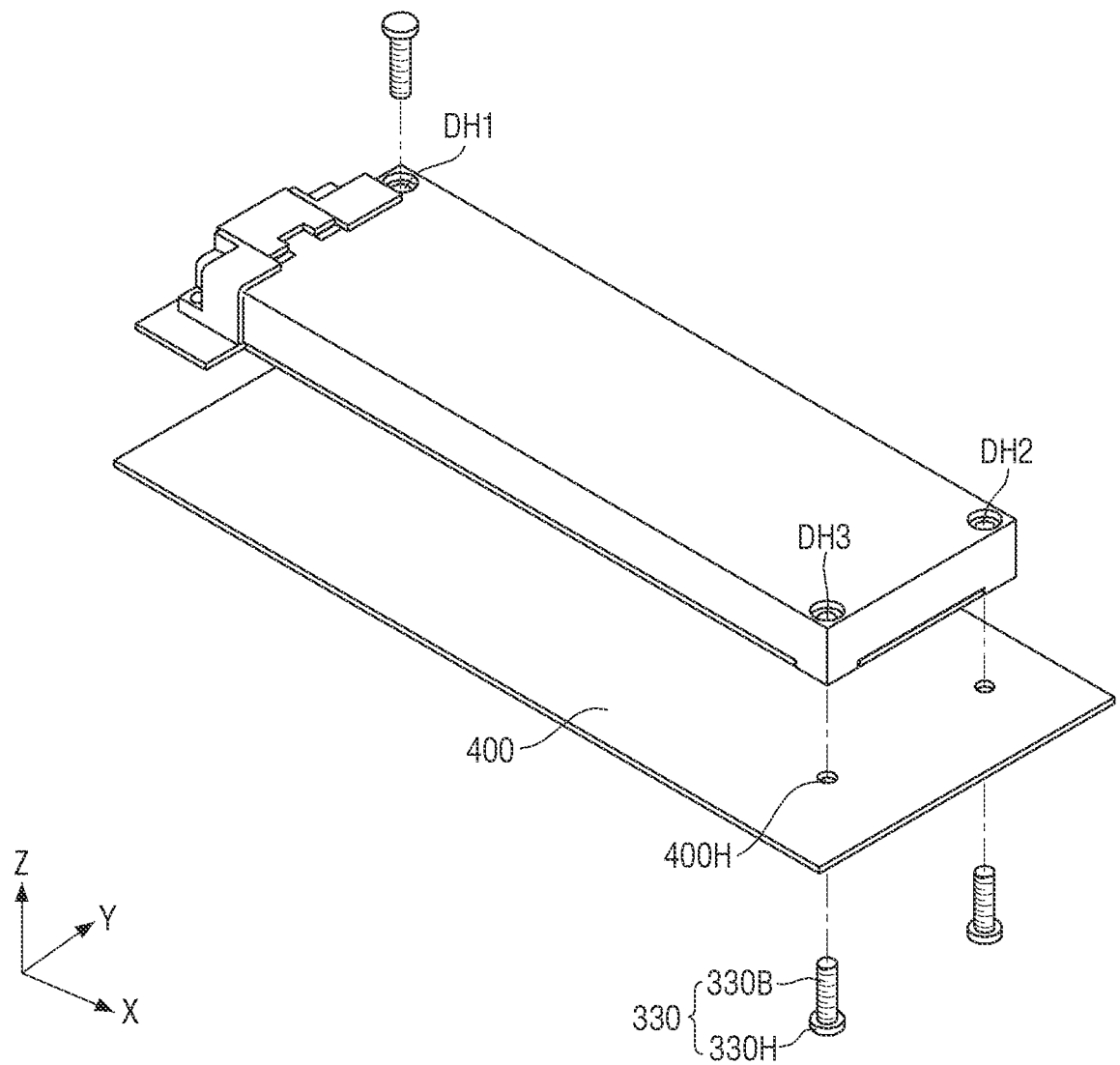
FIG. 15 is a schematic view showing a process of fixing the memory device according to the embodiment to an electronic device.
Figure 16:
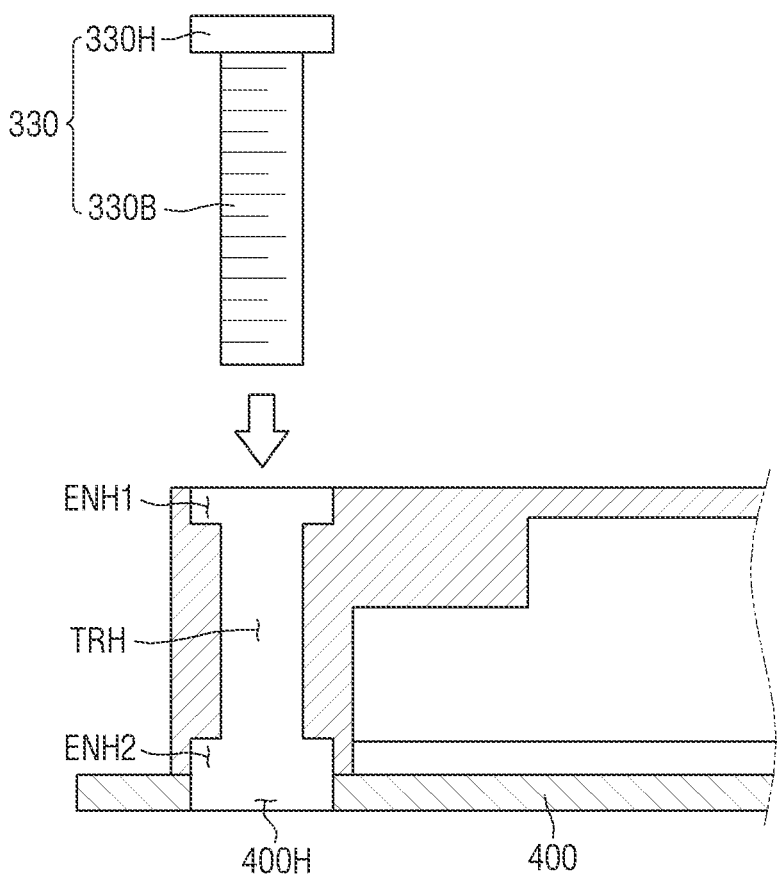
FIG. 16 is a cross-sectional view showing a fixing process at a first inter-device fastening pillar of FIG. 15.
Figure 17:
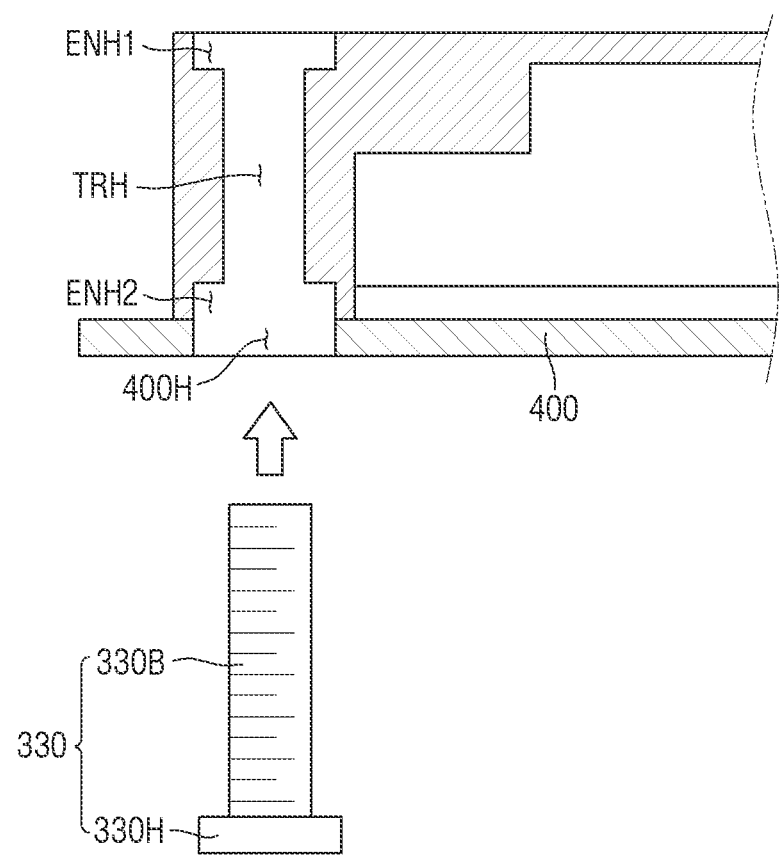
FIG. 17 is a cross-sectional view showing a fixing process at a second inter-device fastening pillar of FIG. 15.

FIG. 15 is a schematic view showing a process of fixing the memory device according to the embodiment to the electronic device. FIG. 16 is a cross-sectional view showing the fixing process at the first inter-device fastening pillar of FIG. 15. FIG. 17 is a cross-sectional view showing the fixing process at the second inter-device fastening pillar FIG. 15.

Referring to FIGS. 15 to 17, the memory device 100 fastened to the host connector 200 may be placed on a host or a fixed member of an electronic device including the host, for example, a system board SBD or a frame 400. The memory device 100 may be fixed to the electronic device through the device screw 330.

As mentioned above, the first enclosure 121 of the memory device 100 may include inter-device fastening pillars DL1 to DL3 including each of three fixed holes DH1 to DH3. Each of the fixed holes DH1 to DH3 includes a penetration hole TRH and expansion holes ENH at both ends thereof. A first expansion hole ENH1 located on the upper side provides a settlement space for the head 300H of the device screw 330 inserted from above, and a second expansion hole ENH2 located on the lower side may provide a settlement space for the head 300H of the device screw 330 inserted from below. Thus, as shown, the memory device 100 allows upward and downward insertion of the device screw 330. Such a fixed structure may be advantageous in terms of process freedom degree of the memory device 100.

For example, all the device screws (i.e., threaded fasteners) 330 of the memory device 100 may be inserted and fixed from above. As another example, all the device screws 330 of the memory device 100 may be inserted and fixed from below. As another example, as shown in FIG. 15, some device screws 330 may be inserted from above and some remaining device screws 330 may be inserted and fixed from below. Such insertion of the device screws 330 from multiple directions allows the fixation to hosts or electronic devices of various structures. Also, since a method having excellent process efficiency may be selected, the process efficiency may be improved. Furthermore, when the device screws 330 are inserted into one memory device 100 in different directions, it is possible to implement a rigid fixing structure against an external force that vibrates in the third direction Z.

Figure 18:
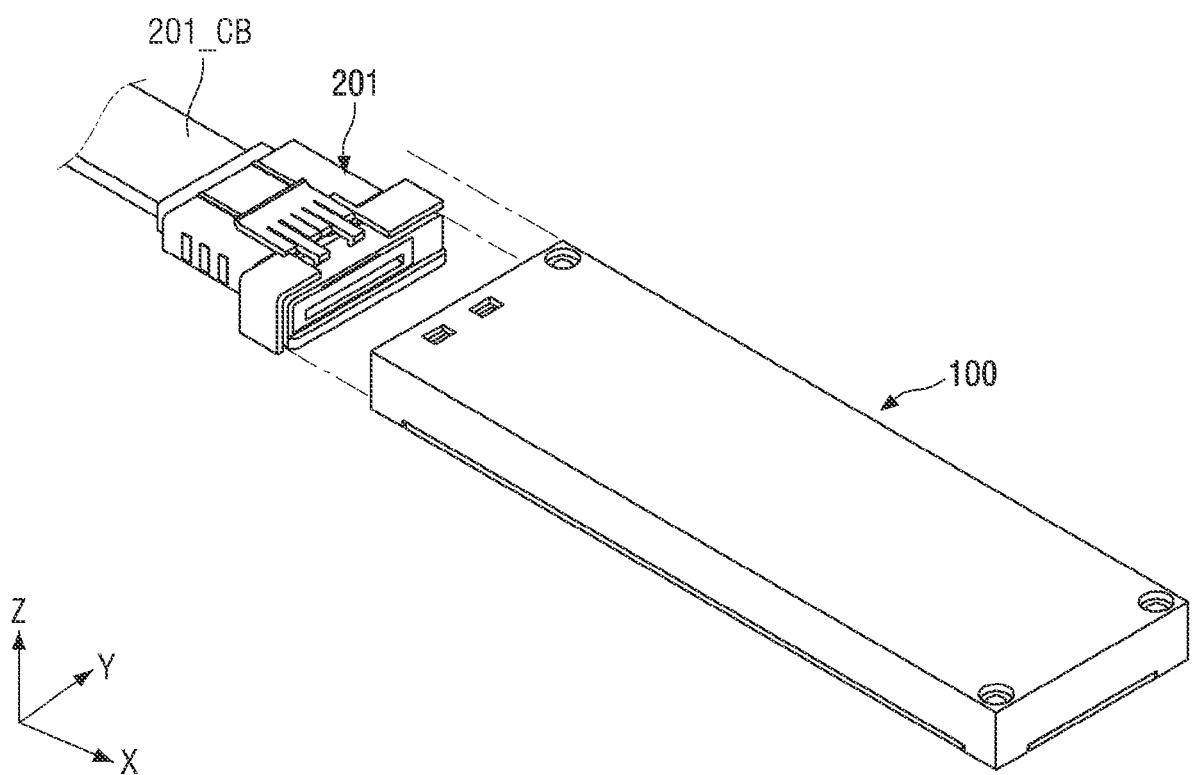
FIG. 18 is a perspective view showing a host connector and a memory device according to another embodiment together.

FIG. 18 is a perspective view showing the host connector and the memory device according to another embodiment. FIG. 18 shows that a cable type connector may be applied as the host connector 201.

Referring to FIG. 18, unlike the embodiment of FIG. 9, the host connector 201 according to the present embodiment is not fixed to a system board or the like, but is provided as a cable type connector instead. A cable 201_CB may be connected to other cables or system boards of the host.

Also in the case of this embodiment, the host connector 201 includes a connector body HB, a plurality of connection terminals EL1 installed in the connector body HB, and a latch 210 installed on the upper face UF of the connector body HB, and the connector body HB includes slots SLT1 and SLT2, as illustrated in FIGS. 9 and 10. When the memory device 100 is inserted into the connector hole COH of the host connector 201, the latch 210 is fastened to the clamping hole CLH of the memory device 100, as described above with respect to FIGS. 9 and 10. Further, the third side cover CV_SF3 of the memory device 100 is inserted into the side slot part SLT1, and the first main cover CVU is inserted into the upper slot part SLT2, respectively. Accordingly, a rigid fastening in which mobility between the memory device 100 and the host connector 201 in the first direction X, the second direction Y, and the third direction Z is restricted may be performed.

In this embodiment, the memory device 100 may be fixed to the frame 400 of the electronic device in the same manner as explained referring to FIGS. 15 to 17.

Hereinafter, other embodiments of the memory device will be explained. In the following embodiments, repeated explanation of the same members as those described above will be simplified or will not be provided, and differences will be mainly explained.

Figure 19:
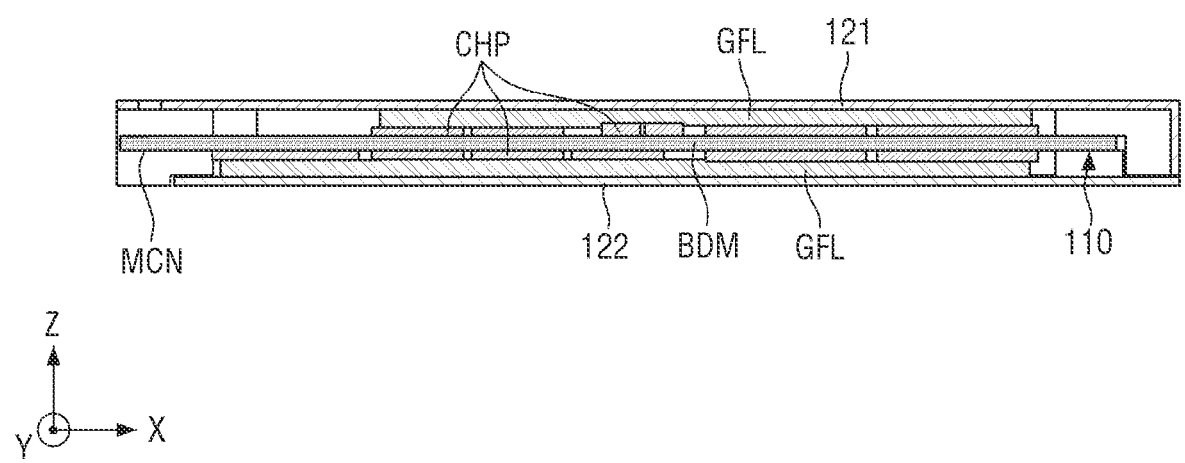
FIG. 19 is a cross-sectional view of a memory device according to another embodiment.

FIG. 19 is a cross-sectional view of the memory device according to another embodiment. FIG. 19 shows that a memory device may further include a gap filler GFL.

Referring to FIG. 19, the gap filler GFL may be placed between the memory module 110 and the enclosure assembly 120. For example, the gap filler GFL may be placed between the upper face UF of the memory module 110 and the lower face BF of the first main cover CVU of the first enclosure 121 and/or between the lower face BF of the memory module 110 and the upper face UF of the second main cover CVB of the second enclosure 122. In this way, if the gap filler GFL fills a vertical gap between the memory module 110 and the enclosure assembly 120, movement of the memory module 110 in the memory device 100 may be further prevented.

The gap filler GFL placed between the memory module 110 and the enclosure assembly 120 may come into contact with the memory module 110 and/or the enclosure assembly 120. Although the gap filler GFL may be fitted between the memory module 110 and the enclosure assembly 120 in a non-attached state, the gap filler GFL may also be fixed to at least one of them by a method such as application, coating, attachment, and fastening.

The gap filler GFL may be made of a hard material or may be made of a soft material. The gap filler GFL may include an insulating material or may include a conductive material, in some cases. When the gap filler GFL includes a conductive material, it may further serve as wiring, electromagnetic wave shielding, and antistatic.

Figure 20:
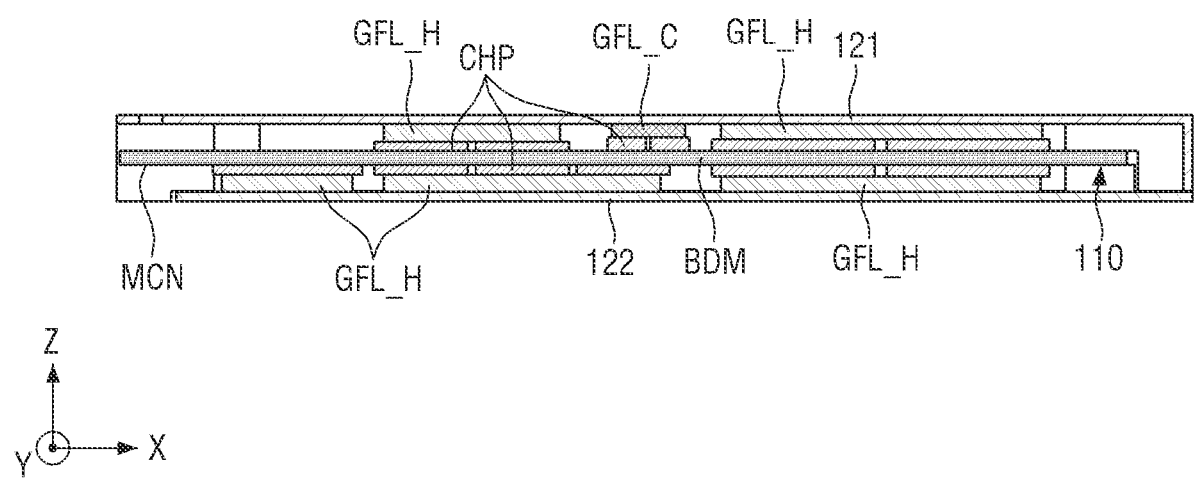
FIG. 20 is a cross-sectional view of a memory device according to still another embodiment.

FIG. 20 is a cross-sectional view of the memory device according to still another embodiment. FIG. 20 shows that a memory device performs additional functions as well as gap filling.

As shown in FIG. 20, the memory device may include a thermal gap filler GFL_H and/or a cushion gap filler GFL_C.

The thermal gap filler GFL_H may include a thermal interface material TIM, a phase change material PCM, or an encapsulated phase change material ePCM. The thermal gap filler GFL_H may not only serve to absorb and store the heat generated from the memory module 110, but also transfer heat to the enclosure assembly 120 side to dissipate heat. The thermal gap filler GFL_H may be placed on an electronic element CHP such as a memory or a memory controller which generates a large amount of heat.

The cushion gap filler GFL_C may serve to absorb shocks and protect adjacent electronic elements CHPs that are vulnerable to shocks. The cushion gap filler GFL_C may include, but is not limited to, polymeric material such as, for example, polyurethane. The cushion gap filler GFL_C may be placed on a capacitor that has a relatively low calorific value but has a high need for external shock protection.

Figure 21:
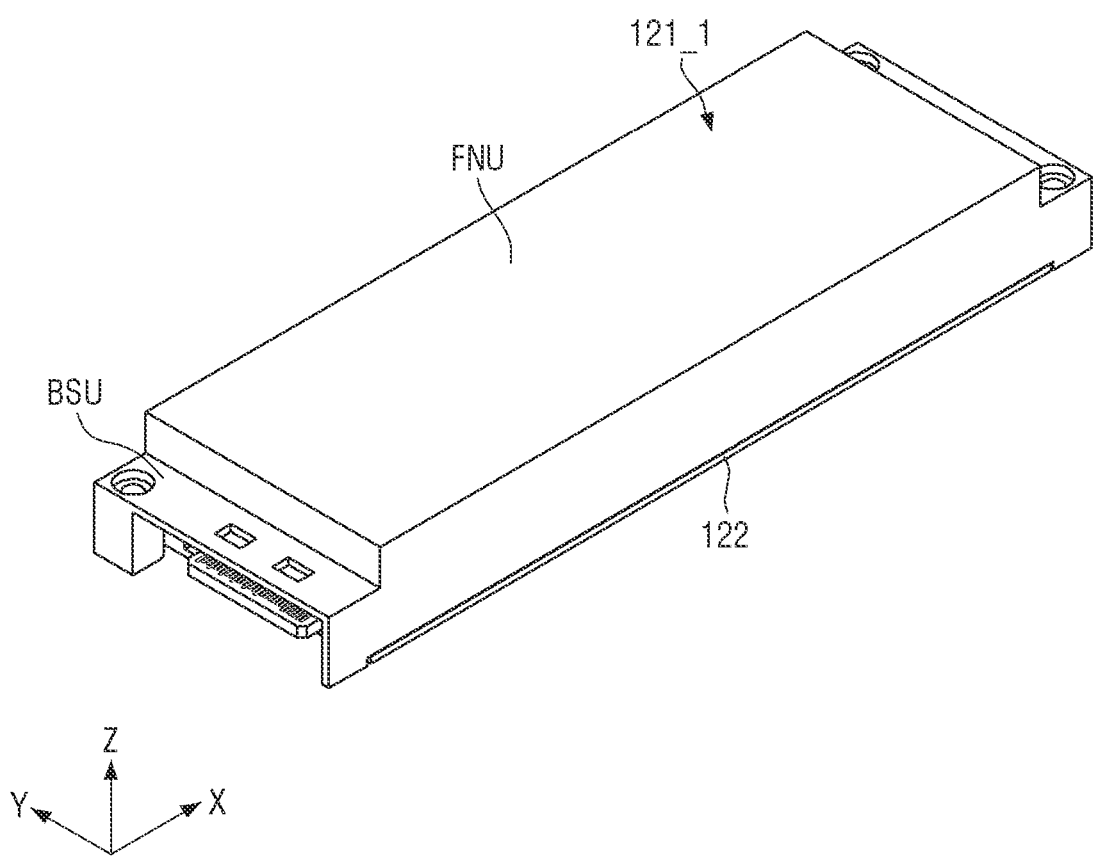
FIG. 21 is a perspective view of a memory device according to still another embodiment.
Figure 22:
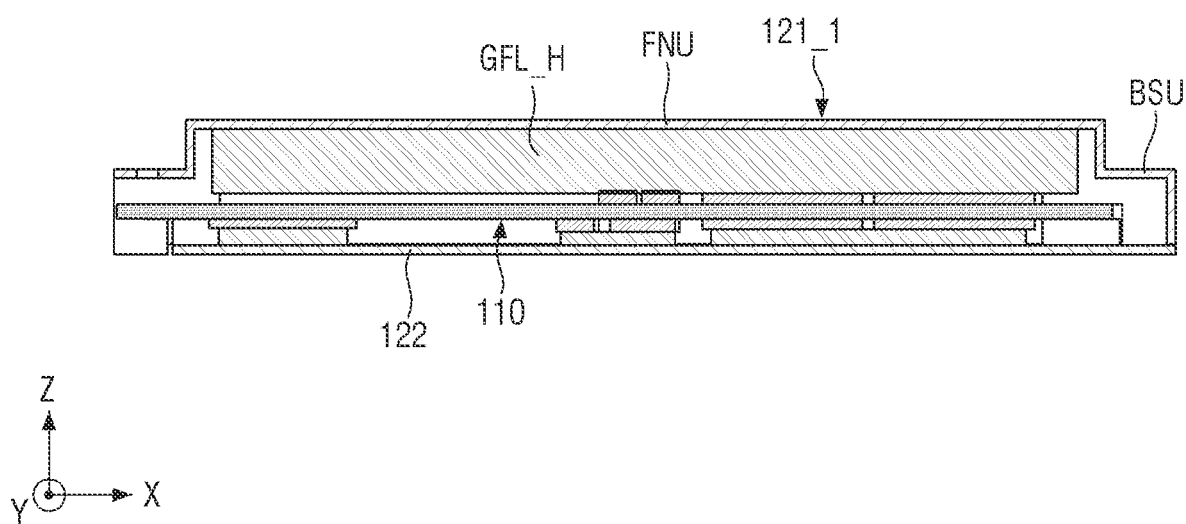
FIG. 22 is a cross-sectional view of FIG. 21 taken in a first direction.

FIG. 21 is a perspective view of the memory device according to another embodiment. FIG. 22 is a cross-sectional view of FIG. 21 taken in the first direction.

Referring to FIGS. 21 and 22, the memory device according to the present embodiment is different from the embodiment of FIGS. 2 to 8 in that the first enclosure 121_1 further includes an upper fin FNU.

The upper fin FNU has a structure protruding upward from the first base BSU. The first base BSU and the upper fin FNU form a step structure on the upper face UF of the enclosure 121_1. The height of the upper fin FNU protruding from the first base BSU may be about 6.5 mm. The protrusion of the upper fin FNU increases the height of the memory device, and the maximum height of the memory device may become 15 mm.

The upper fin FNU may be formed by bending the first main cover CVU of the first enclosure 121_1. The first base BSU and the upper fin FNU may be provided as an integral structure. The thickness of the first base BSU and the thickness of the upper fin FNU may be uniform, but are not limited thereto.

As the upper fin FNU is provided in the first enclosure 121_1, the surface area of the first enclosure 121 may be enlarged. When the surface area of the first enclosure 121_1 is enlarged, the heat capacity may increase.

Also, an additional space as a result of the protruding height of the upper fin FNU may be generated below the upper fin FNU of the first enclosure 121_1. When the thermal gap filler GFL_H including TIM, PCM, ePCM, and the like is placed in the additional space, the heat capacity increasing material may be further filled by the increased volume, and the entire heat capacity of the memory device can be further increased.

The upper fin FNU may have a rectangular shape that extends in the first direction X in the plan view. The first base BSU is located near the first short side SS1 on which the clamping hole CLH is placed and the second short side SS2 on which the second and third inter-device fastening pillars DL3 are placed, and the upper fin FNU may be located in the region between them. The first short side SS1 and the second short side SS2 of the upper fin FNU may be located generally near the first short side SS1 and the second short side SS2 of the module board BDH. In an embodiment, the first short side SS1 and the second short side SS2 of the upper fin FNU may be located on the inner side than the first short side SS1 and the second short side SS2 of the module board BDH, but the embodiment is not limited thereto.

The first side face SF1 and the third side face SF3 of the upper fin FNU may each be connected to the first side cover CV_SF1 and the second side cover CV_SF2 of the first enclosure 121_1 without steps. The first side face SF1 and the third side face SF3 of the upper fin FNU may be placed on the same XZ plane with respect to the first side cover CV_SF1 and the second side cover CV_SF2, but the embodiment is not limited thereto.

Figure 23:
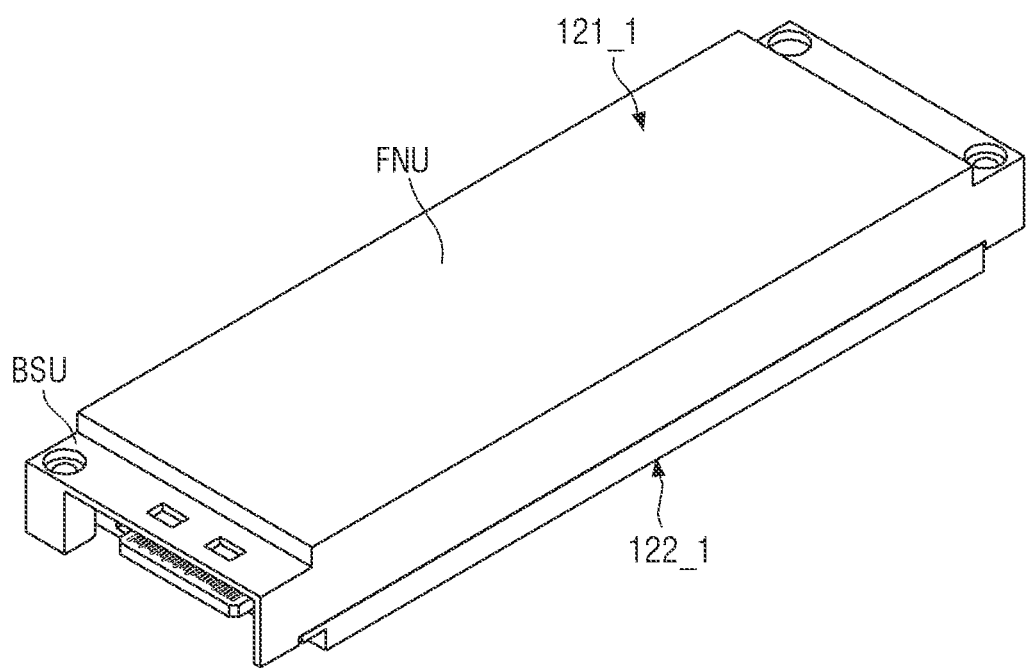
FIG. 23 is a perspective view of a memory device according to still another embodiment.
Figure 24:
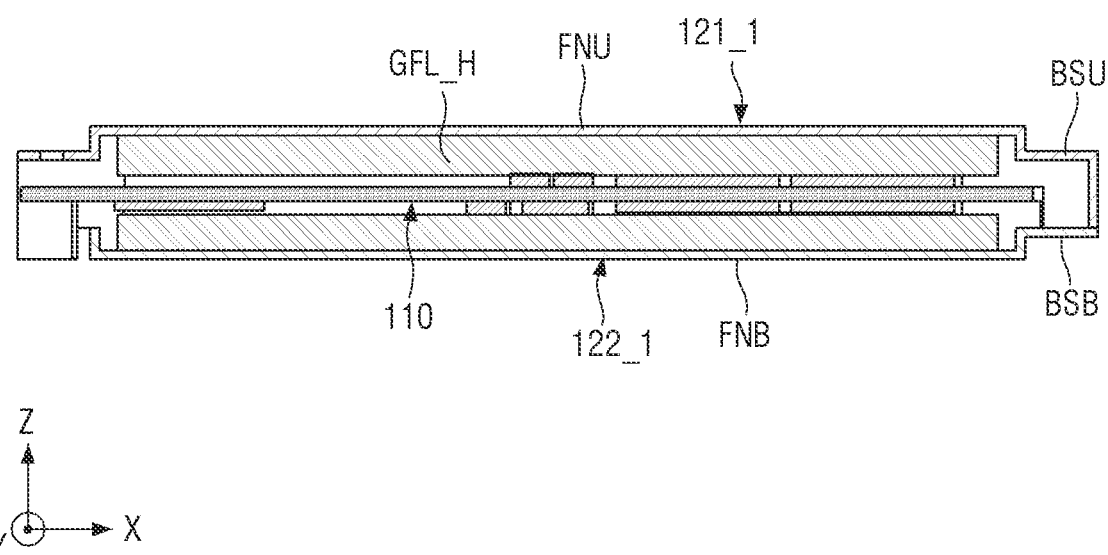
FIG. 24 is a cross-sectional view of FIG. 23 taken in the first direction.

FIG. 23 is a perspective view of the memory device according to another embodiment. FIG. 24 is a cross-sectional view of FIG. 23 taken in the first direction.

Referring to FIGS. 23 and 24, the present embodiment differs from the embodiment of FIGS. 21 and 22 in that the memory device includes not only the upper fin FNU but also a lower fin FNB.

Specifically, the first enclosure 121_1 includes an upper fin FNU, and the second enclosure 122 includes a lower fin FNB. The lower fin FNB has a structure that protrudes downward from the second base BSB. The lower fin FNB may be formed by bending the second main cover CVB of the second enclosure 122. The second base BSB and the lower fin FNB may be provided as an integral structure. Although the thickness of the second base BSB and the thickness of the lower fin FNB may be uniform, the embodiment is not limited thereto. The lower fin FNB may be formed in a shape symmetrical with the upper fin FNU.

As the lower fin FNB is provided in the second enclosure 122_1, the surface area of the second enclosure 122 may be enlarged. When the surface area of the second enclosure 122_1 is enlarged, the heat capacity may increase.

Also, an additional space as a result of the protruding height of the lower fin FNB is generated above the lower fin FNB of the second enclosure 122_1. When the thermal gap filler GFL_H related to the heat capacity is filled in the additional space, the entire heat capacity of the memory device can be further increased.

In this embodiment, the height of the memory device may be increased by the sum of the protruding heights of the upper fin FNU and the lower fin FNB. If the height increase of the memory device by the fins FNU and FNB needs to be designed to about 6.5 mm as in the embodiments of FIGS. 21 and 22, protruding height of the upper fin FNU and the lower fin FNB may be adjusted accordingly. In an embodiment, the protruding height of the upper fin FNU and the protruding height of the lower fin FNB may be the same 3.25 mm, respectively.

When compared with the embodiments of FIGS. 21 and 22, if the height of the upper fin FNU and the height of the lower fin FNB are 6.5 mm, the volume increase due to the fins FNU and FNB may not be substantially different from the embodiments of FIGS. 21 and 22. However, this embodiment is also distinguished from the embodiments of FIGS. 21 and 22 in that heat absorption or heat dissipation paths are additionally provided in both the upper part and the lower part of the memory module 110. Based on such a difference, an appropriate embodiment may be selected in consideration of the arrangement position or the like of the heat generation elements in the memory module 110. In some cases, by including all the upper fin FNU and the lower fin FNB, but by setting these heights to be different from each other, volume of the additional space provided at the upper part and the lower part of the memory module 110 can also be adjusted precisely.

Figure 25:
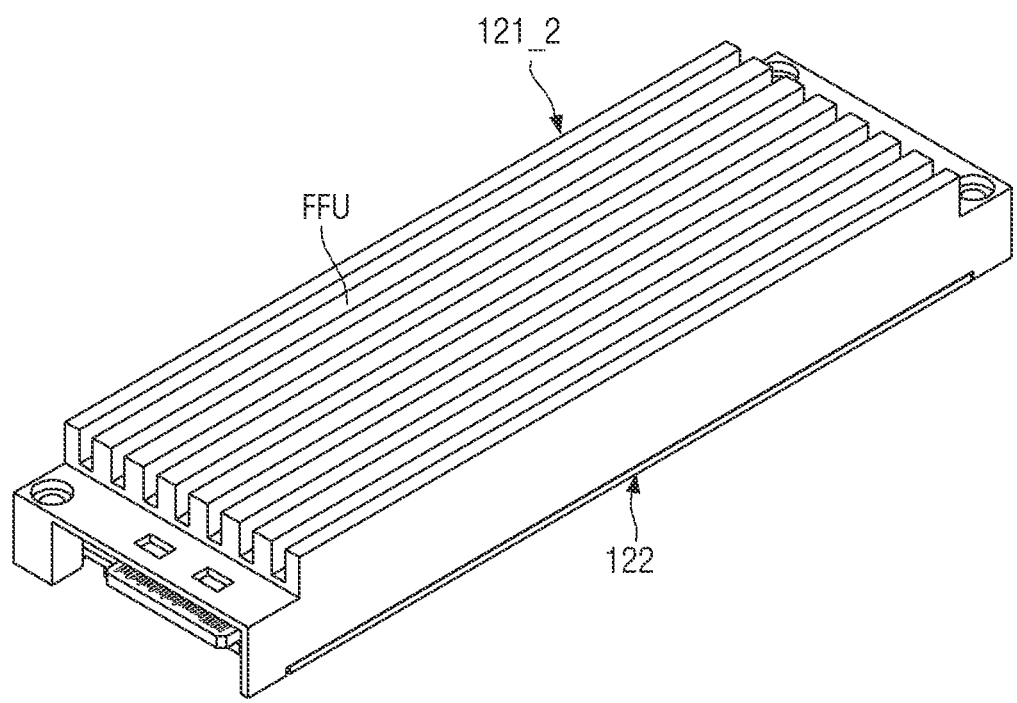
FIG. 25 is a perspective view of a memory device according to still another embodiment.
Figure 26:
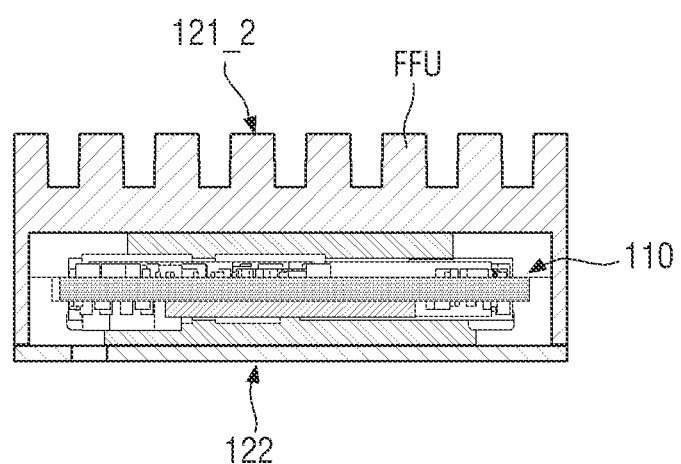
FIG. 26 is a cross-sectional view of FIG. 25 taken along a second direction.

FIG. 25 is a perspective view of the memory device according to another embodiment. FIG. 26 is a cross-sectional view of FIG. 25 taken along the second direction.

Referring to FIGS. 25 and 26, the memory device according to the present embodiment is different from the embodiments of FIGS. 21 and 22 in that the upper fin FNU of the first enclosure 121_2 includes a plurality of upper sub-fins FFU.

The upper fin FNU has a structure protruding upward from the first base BSU. The upper fin FNU includes a plurality of upper sub-fins FFU. Each upper sub-fin FFU may be arranged along the second direction Y. A space between the upper sub-fins FFU is also located to protrude upward from the first base BSU. In an embodiment, the maximum height of the upper sub-fin FFU may be 6.5 mm.

In an exemplary embodiment, the number of upper sub-fins FFU may be eight. The width of the upper sub-fin FFU in the second direction Y is generally uniform, but the upper sub-fin FFU located at both ends in the second direction Y may have a width smaller than the central upper sub-fin FFU. A gap between the upper sub-fins FFU may, but is not limited to, be about the same as the width of the upper fin FNU.

This embodiment shows a case where the lower space of the protruding upper fin FNU is filled with the first enclosure 121_2 material itself rather than the thermal gap filler GFL_H. In this case, if the first enclosure 121_2 is made of a material such as TIM, PCM, and ePCM, it may be advantageous to increase the heat capacity. Furthermore, in the case of this embodiment, the surface area of the first enclosure 121_2 may be further increased by including a plurality of upper sub-fins FFU. Therefore, it is possible to expect an increase in heat capacity with an increase in the surface area of the first enclosure 121_2.

Figure 27:
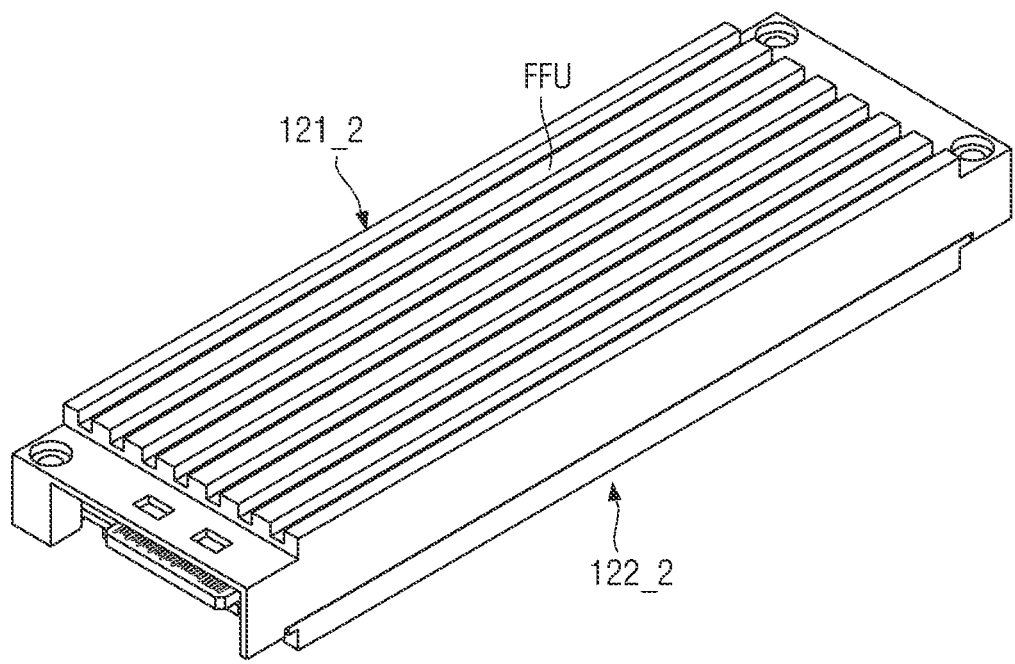
FIG. 27 is a perspective view of a memory device according to still another embodiment.
Figure 28:
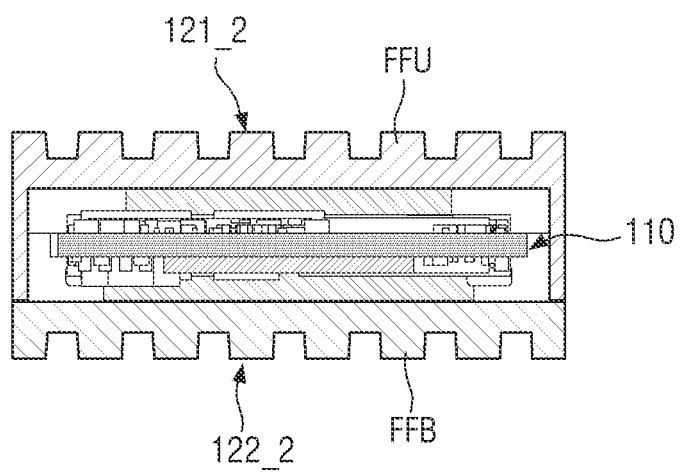
FIG. 28 is a cross-sectional view of FIG. 27 taken in the second direction.

FIG. 27 is a perspective view of the memory device according to still another embodiment. FIG. 28 is a cross-sectional view of FIG. 27 taken along the second direction.

Referring to FIGS. 27 and 28, the memory device according to the present embodiment is different from the embodiments of FIGS. 25 and 26 in that the second enclosure 122_2 further includes a lower fin FNB including a plurality of lower sub-fins FFB. The sum of the maximum height of the upper sub-fin FFU and the maximum height of the lower sub-fin FFB may be 6.5 mm.

In an exemplary embodiment, the number of lower sub-fins FFB may be eight. The arrangement of the lower sub-fins FFB may be substantially the same as the arrangement of the upper sub-fins FFU. As in the embodiments of FIGS. 23 and 24, the upper space of the lower fin FNB may be filled with the second enclosure 122 material.

In the case of this embodiment, as compared with the embodiments of FIGS. 25 and 26, heat adsorption or heat dissipation path may be additionally provided in both the upper part and the lower part of the memory module 110. As explained in the embodiments of FIGS. 23 and 24, an appropriate embodiment may be selected in consideration of the arrangement position of the heat generation elements and the like in the memory module 110, on the basis of the aforementioned differences.

Those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:
1. A memory device comprising:
an enclosure assembly; and a memory module disposed within the enclosure assembly, the memory module comprising a module board and a memory connector on one side of the module board;

wherein the enclosure assembly comprises a first enclosure above the memory module, and a second enclosure below the memory module, wherein the first enclosure comprises a first main cover that covers upper faces of the module board and the memory connector, a first side cover that extends downward from a first long side of the first main cover, a second side cover that extends downward from a second short side of the first main cover, and a third side cover that extends downward from a second long side of the first main cover, wherein the second enclosure comprises a second main cover, wherein the second main cover is a flat plate comprising an inner surface, and wherein a free end of the first side cover, a free end of the second side cover, and a free end of the third side cover each are in overlying face to face contact with the inner surface of the second main cover, wherein at least one clamping hole penetrates the first main cover at a position overlapping the memory connector, wherein an inter-device fastening pillar protrudes downward from an inner face of the first main cover, wherein an end portion of the inter-device fastening pillar and an outer face of the second main cover are co-planar, and wherein a fixed hole extends through the inter-device fastening pillar and the first main cover.

2. The memory device of claim 1, wherein the second main cover at least partially covers a lower face of the module board.

3. The memory device of claim 2, wherein the first main cover has a rectangular configuration and wherein the memory connector is located on a first short side of the first main cover.

4. The memory device of claim 2, wherein the module board comprises a module fastening hole, wherein the second enclosure comprises a coupling hole that overlaps the module fastening hole, and wherein the first enclosure comprises a coupling groove in communication with to the module fastening hole and the coupling hole.

5. The memory device of claim 4, further comprising:

a fastener that penetrates the coupling hole of the second enclosure and the module fastening hole from a lower part of the second main cover, and that is inserted into the coupling groove.

6. The memory device of claim 1, wherein the second main cover comprises a first long side, a second long side, a first short side, and a second short side, wherein an outer face of the first side cover is co-planar with a side face of the first long side of the second main cover, wherein an outer face of the second side cover is co-planar with a side face of the second short side of the second main cover, and wherein an outer face of the third side cover is co-planar with the side face of the second long side of the second main cover.

7. The memory device of claim 1, wherein the fixed hole comprises a penetration hole, a first expansion hole above the penetration hole and having an inner diameter greater than an inner diameter of the penetration hole, and a second expansion hole below the penetration hole and having an inner diameter greater than the inner diameter of the penetration hole.

8. The memory device of claim 7, wherein the first expansion hole and the second expansion hole are symmetrical.

9. The memory device of claim 1, wherein the first main cover comprises a first base part and a first fin protruding outward from the first base part.

10. The memory device of claim 9, wherein the second main cover further comprises a second fin protruding outward from the flat plate.

11. The memory device of claim 10, wherein the memory connector extends from the module board in a first direction, wherein each of the first and second fins comprises a plurality of sub-fins arranged in a second direction that is transverse to the first direction, and wherein each of the sub-fins extends in the first direction.

12. An electronic device comprising:

a memory module comprising a memory connector;

a memory device comprising an enclosure assembly which accommodates the memory module, the enclosure assembly comprising one or more clamping holes on an upper face thereof;

a connector body comprising a connector hole and a slot; and a host connector configured to be installed on an upper face of the connector body, wherein the host connector comprises a latch, wherein the latch comprises a latch body having opposite free ends, a hook at one of the free ends, wherein the latch body is pivotably connected to the connector body between the opposite free ends, and wherein the latch body is maintained parallel with the upper face of the connector body by a spring when the memory connector is engaged with the connector body and when the memory connector is not engaged with the connector body.

13. The electronic device of claim 12, wherein the memory connector is inserted into the connector hole, the hook is fastened to the clamping hole, and at least a part of the enclosure assembly is inserted into the slot.

14. The electronic device of claim 13, wherein the latch body is pivotably connected to the connector body at a joint, and wherein the joint comprises the spring.

15. The electronic device of claim 12, wherein the enclosure assembly further comprises at least one fixed hole, the at least one fixed hole comprising:

a penetration hole, a first expansion hole above the penetration hole, wherein the first expansion hole has an inner diameter greater than an inner diameter of the penetration hole, and a second expansion hole below the penetration hole, wherein the second expansion hole has an inner diameter greater than the inner diameter of the penetration hole.

16. The electronic device of claim 15, further comprising:

at least one fastener accommodation hole, and at least one fastener configured to be inserted into the at least one fastener accommodation hole and the at least one fixed hole.

17. The electronic device of claim 16, wherein the fastener accommodation holes, the fixed holes and the fasteners are multiple respectively, wherein some of the plurality of fasteners are inserted into respective ones of the fixed holes and fastener accommodation holes from above the fixed holes, and wherein some of the plurality of fasteners are inserted into respective ones of the fixed holes and fastener accommodation holes from below the fixed holes.

18. The electronic device of claim 12, wherein the enclosure assembly comprises a first enclosure above the memory module, and a second enclosure below the memory module.

19. The electronic device of claim 18, wherein the first enclosure comprises a first main cover that covers an upper face of the memory connector, and wherein the second enclosure comprises a second main cover.

20. A memory device comprising:
   an enclosure assembly; and
   a memory module disposed within the enclosure assembly, the memory module comprising a module board, and a memory connector on one side of the module board;
   wherein the enclosure assembly comprises a first enclosure above the memory module, and a second enclosure below the memory module, wherein the first enclosure comprises a first main cover that covers upper faces of the module board and the memory connector, wherein the second enclosure comprises a second main cover, wherein inter-device fastening pillars protrude downward from an inner face of the first main cover, and wherein an end portion of the inter-device fastening pillars and an outer face of the second main cover are co-planar;
   wherein at least one of the first main cover and the second main cover comprises a base part and a fin protruding outward from the base part,
   wherein the first main cover includes a first corner, a second corner, a third corner and a fourth corner,
   the first corner and the fourth corner are adjacent to the memory module in a plan view,
   the second corner and the third corner are opposite to the first corner and the fourth corner,
   the inter-device fastening pillars are disposed at the first corner, the second corner and the third corner, and
   the inter-device fastening pillars are not disposed at the fourth corner.

* * * * *